(12) United States Patent  
Sakamoto et al.

(10) Patent No.: US 11,404,398 B2  
(45) Date of Patent: Aug. 2, 2022

(54) METHOD OF MOUNTING SEMICONDUCTOR ELEMENTS AND METHOD OF MANUFACTURING SEMICONDUCTOR DEVICE USING A STRETCHED FILM

(71) Applicant: NICHIA CORPORATION, Anan (JP)

(72) Inventors: Masakazu Sakamoto, Tokushima (JP); Kenji Suzuki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 238 days.

(21) Appl. No.: 16/726,315

(22) Filed: Dec. 24, 2019

(65) Prior Publication Data

US 2020/0212016 A1     Jul. 2, 2020

(30) Foreign Application Priority Data

Dec. 27, 2018   (JP) .............................. JP2018-246087

(51) Int. Cl.
    *H01L 21/00*        (2006.01)  
    *H01L 25/075*      (2006.01)  
             (Continued)

(52) U.S. Cl.
    CPC ...... *H01L 25/0753* (2013.01); *H01L 21/6836* (2013.01); *H01L 33/52* (2013.01);  
             (Continued)

(58) Field of Classification Search
    CPC . H01L 25/0753; H01L 21/6836; H01L 33/62; H01L 33/52; H01L 21/568;  
             (Continued)

(56) References Cited

U.S. PATENT DOCUMENTS

| 7,842,552 B2 * | 11/2010 | Karidis ................. H01L 23/053 438/121 |
| 2007/0187816 A1 * | 8/2007 | Bauer ..................... H01L 24/95 257/723 |

(Continued)

FOREIGN PATENT DOCUMENTS

| JP | 2010-147317 A | 7/2010 |
| JP | 2015-211079 A | 11/2015 |
| JP | 2016-195154 A | 11/2016 |

*Primary Examiner* — Ismail A Muse  
(74) *Attorney, Agent, or Firm* — Squire Patton Boggs (US) LLP

(57) ABSTRACT

A method of mounting semiconductor elements, including stretching a stretchable film against an elastic force into a stretched state and disposing a plurality of semiconductor elements in predetermined regions on the stretchable film in the stretched state. Each of the predetermined regions have a predetermined group of semiconductor elements spaced apart from one other at a first distance. The stretchable film is released from the stretched state by using the elastic force of the stretchable film. The first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state.

25 Claims, 31 Drawing Sheets

(51) Int. Cl.
*H01L 21/683* (2006.01)
*H01L 33/62* (2010.01)
*H01L 33/52* (2010.01)
*H01L 21/56* (2006.01)

(52) U.S. Cl.
CPC ............ *H01L 33/62* (2013.01); *H01L 21/568* (2013.01); *H01L 2221/68359* (2013.01); *H01L 2933/005* (2013.01); *H01L 2933/0066* (2013.01)

(58) Field of Classification Search
CPC ... H01L 2221/68359; H01L 2933/0066; H01L 2933/005; H01L 2224/96; H01L 2924/181; H01L 2221/68336; H01L 2221/68354; H01L 21/561; H01L 33/50; H01L 2933/0041; H01L 33/0095
See application file for complete search history.

(56) References Cited

U.S. PATENT DOCUMENTS

| | | | | |
|---|---|---|---|---|
| 2007/0289384 | A1* | 12/2007 | Sakai | G01P 15/125 73/514.32 |
| 2016/0111604 | A1* | 4/2016 | Li | H01L 24/95 257/91 |
| 2017/0254518 | A1* | 9/2017 | Vasylyev | G02B 6/0068 |
| 2017/0323805 | A1* | 11/2017 | Kotera | C09J 7/24 |
| 2018/0247872 | A1* | 8/2018 | Brunnbauer | H01L 23/544 |
| 2021/0050535 | A1* | 2/2021 | Xue | H01L 27/3276 |

* cited by examiner

METHOD OF MOUNTING SEMICONDUCTOR ELEMENTS AND METHOD OF MANUFACTURING SEMICONDUCTOR DEVICE USING A STRETCHED FILM

CROSS-REFERENCE TO RELATED PATENT APPLICATION

The present application claims priority under 35 U. S. C. § 119 to Japanese Patent Application No. 2018-246087, filed Dec. 27, 2018. The contents of Japanese Patent Application No 2018-246087 are incorporated herein by reference in their entirety.

BACKGROUND

Field

Embodiments of the present invention relate to a method of mounting semiconductor elements and a method of manufacturing a semiconductor device.

Description of the Related Art

In manufacturing light emitting devices, a plurality of light-emitting elements have been mounted on a single substrate. For example, in a method of manufacturing a light-emitting device disclosed in Japanese Unexamined Patent Application Publication No. 2016-195154, when a plurality of light-emitting elements arranged on a single substrate are collectively joined to another substrate, the light-emitting elements can be bonded to desired positions of the another substrate even when the substrates have different linear expansion coefficiencies.

SUMMARY

A method of mounting semiconductor elements according to certain embodiments can include stretching a stretchable film against an elastic force into a stretched state and disposing a plurality of semiconductor elements in predetermined regions on the stretchable film in the stretched state. Each of the predetermined regions can have a predetermined group of semiconductor elements spaced apart from one other at a first distance. The stretchable film is released from the stretched state by using the elastic force of the stretchable film, such that the first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state.

In certain embodiments, the method can include performing the method of mounting semiconductor elements described above, in which each of the semiconductor elements has first and second electrodes, covering the semiconductor elements by a covering member, and removing the stretchable film to expose the electrodes of each of the semiconductor elements.

In certain embodiments, the method can include performing the method of mounting semiconductor elements described above, in which each of the semiconductor elements has first and second electrodes, disposing the semiconductor elements on a support substrate such that a surface of each of the semiconductor elements opposite from the electrodes are opposite to the support substrate, and removing the stretchable film to expose the electrodes of each of the semiconductor elements.

In certain embodiments, the method can include performing the method of mounting semiconductor elements described above, in which each of the semiconductor elements has first and second electrodes, and disposing the semiconductor elements on a support substrate such that the electrodes are opposite to the support substrate. The stretchable film can then be removed, and the semiconductor elements are covered by a covering member. Predetermined groups of the semiconductor elements are separated into discrete groups each including a predetermined number of one or more semiconductor elements.

In certain embodiments, the method can include performing the method of mounting semiconductor elements described above, in which each of the semiconductor elements has electrodes, and disposing the semiconductor elements on a support substrate such that the electrodes are opposite to the support substrate. A covering member is disposed between the support substrate and the stretchable film to cover lateral surfaces of each of the plurality of semiconductor elements. The stretchable film is removed, and predetermined groups of the semiconductor elements are separated into discrete groups each including a predetermined number of one or more semiconductor elements.

In certain embodiments, the method can include disposing wiring patterns on a stretchable film, stretching the stretchable film against an elastic force into a stretched state and disposing a plurality of semiconductor elements in predetermined regions on the stretchable film in the stretched state, each of the predetermined regions to have a predetermined group of semiconductor elements spaced apart from one other at a first distance. The stretchable film is released from the stretched state by using the elastic force of the stretchable film. In the disposing wiring patterns, a plurality of pairs of wiring patterns each having a first wiring and a second wiring and a region for disposing a corresponding one of the plurality of semiconductor elements are disposed at uniform intervals such that regions for disposing the plurality of semiconductor elements are aligned in a transverse direction in a plan view. Also, the first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

In the following, certain embodiments will be described with reference to the drawings. The embodiments illustrated below are to exemplify a light emitting device, a method of mounting semiconductor elements, and a method of manufacturing a semiconductor device, for embodying the technical idea of the embodiments of the present invention, and the technical idea of the present invention is not limited thereto. The sizes, materials, shapes and the relative positions of the members described in embodiments are given as examples and not as limitation to the scope of the invention unless specifically stated. The sizes and the positional relationships of the members in each of the drawings are occasionally shown exaggerated for ease of explanation.

First Embodiment

Semiconductor Device

A semiconductor device according to a first embodiment will be described below.

Figure 1A:
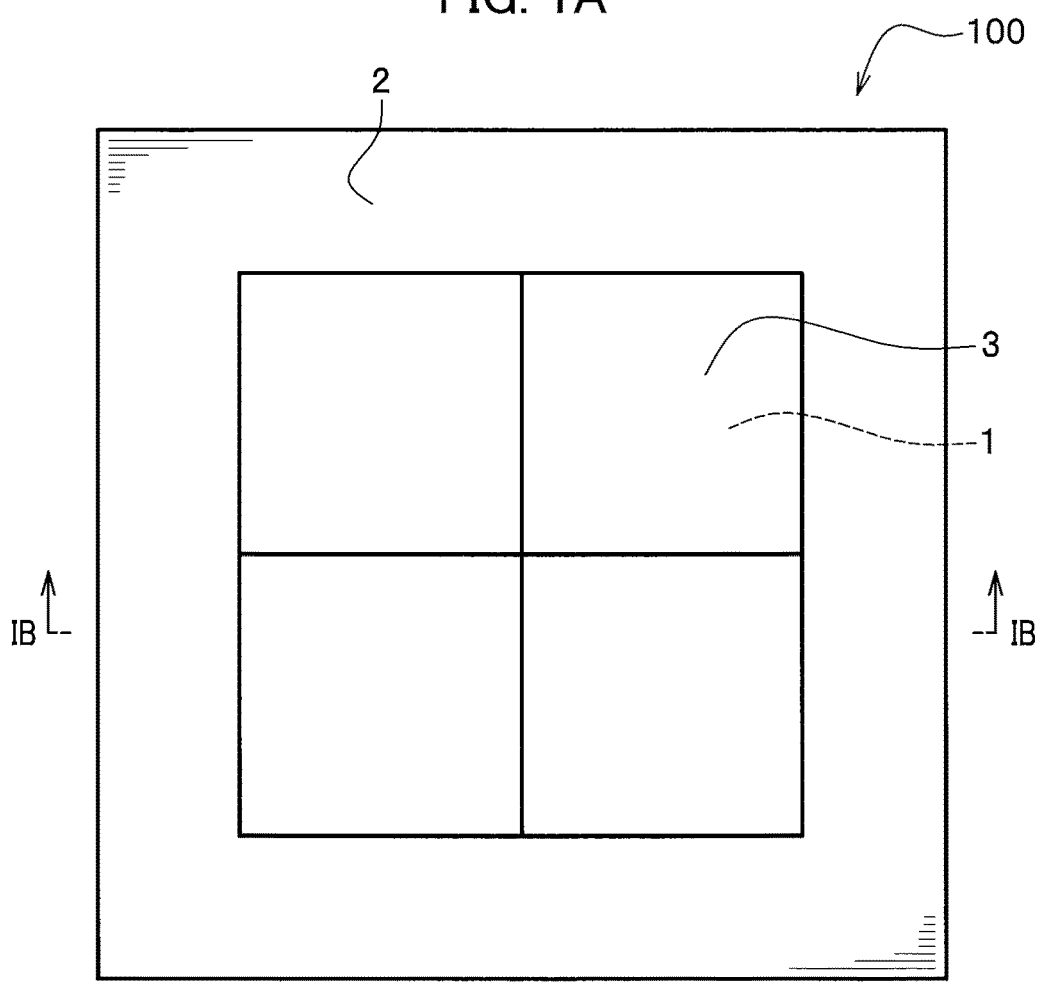
FIG. 1A is a plan view schematically showing a configuration of a semiconductor device according to a first embodiment.
Figure 1B:
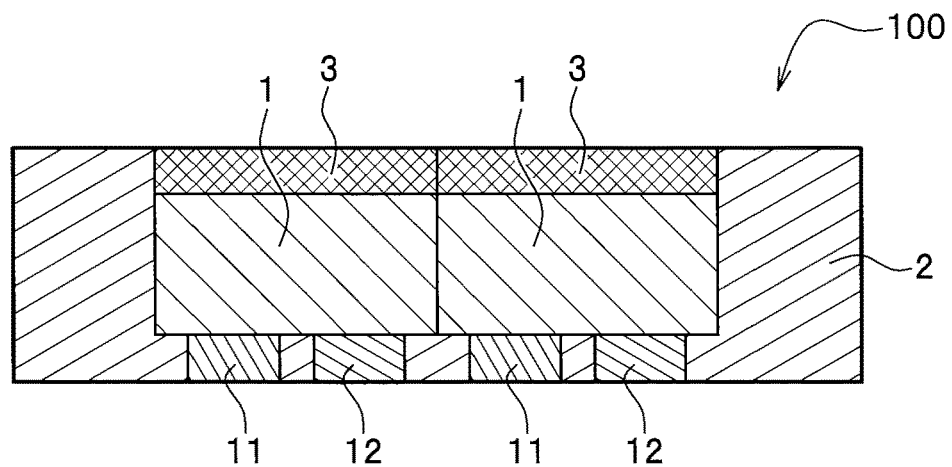
FIG. 1B is a cross-sectional view schematically showing a configuration of a light emitting device according to the first embodiment, taken along line IB-IB of FIG. 1A.

FIG. 1A is a plan view schematically showing a configuration of a semiconductor device according to a first embodiment. FIG. 1B is a cross-sectional view schematically showing a configuration of a light emitting device according to the first embodiment, taken along line IB-IB of FIG. 1A.

The semiconductor device 100 includes a plurality of semiconductor elements 1, a covering member 2, and a plurality of wavelength converting members 3. In the semiconductor device 100, four semiconductor elements 1 are disposed in a matrix of 2 rows×2 columns.

Semiconductor Element

For the semiconductor elements 1, semiconductor light emitting elements such as ICs and/or LSIs, and/or LED elements can be used. Among those, LED elements are preferably used. The semiconductor elements 1 respectively have positive and negative electrodes 11 and 12 (hereinafter may be referred to as "electrodes 11 and 12" or "first and second electrodes 11 and 12") disposed on respective element structures constituted with various semiconductors. In particular, the semiconductor elements 1 are preferably nitride-based semiconductors ($In_xAl_yGa_{1-x-y}N$, $0 \leq x$, $0 \leq y$, $x+y \leq 1$) that can efficiently excite corresponding fluorescent material(s). Also, zinc sulfide-based semiconductor(s), lead selenide-based semiconductor(s), and/or silicon carbide-based semiconductor elements may be used as the semiconductor elements 1.

In the description below, the semiconductor elements 1 will be described as semiconductor light emitting elements.

The semiconductor elements 1 may respectively have a planar shape, for example, a square shape with a side in a range of 100 µm to 2 mm, but a polygonal shape such as a triangular shape, a quadrangular shape, a pentagonal shape, a hexagonal shape, or an octagonal shape may be employed, or a combination of various polygonal shapes may be employed. The shape of each of the semiconductor elements 1 is preferably determined according to a combination shape of a predetermined number of the semiconductor elements 1. In the first embodiment, four semiconductor elements 1 each having a square shape in a plan view are used to form a single group of a square shape. The shape of a single group can be appropriately selected. For example, six square semiconductors 1 may be used two in row and three in columns to form a single group of a rectangular shape, or ten square semiconductor elements 1 may be arranged two in a first row, four in a second row, four in a third row, and two in a fourth row to form a group of a nearly octagonal shape or a nearly circular shape. Further, three square semiconductor elements 1 are arranged in an L-shape and a single rectangular semiconductor element 1 is arranged inward of the L-shape to form a group of a pentagonal shape, such that by appropriately arranging a plurality of groups of the pentagonal shape and a plurality of group of the square shape, larger interior angles can be obtained and a smoother entire peripheral shape can be obtained.

Each of the adjacent semiconductor elements 1 in each of the predetermined regions are spaced apart from each other with the second distance in a range of 0 to 50 μm, more preferably in a range of 5 to 40 μm. The second distance of 0 μm or greater can facilitate manufacturing of the semiconductor device 100, and the distance of 5 μm allows for a high density mounting of the semiconductor elements 1 not to interfere with each other. Meanwhile, the second distance of 50 μm or less allows for a higher density mounting of the semiconductor elements 1, which allows for a reduction in the dimensions of the semiconductor device 100. The distance between each two adjacent semiconductor elements can be further adjusted according to the stretchability of the stretchable film 20. For example, when the stretchable film 20 has a large stretchability, the second distance between adjacent semiconductor elements 1 can be 50 μm or greater.

Covering Member

The covering member 2 is a light-reflecting member to reflect portions of light emitted from the semiconductor elements 1 traveling in lateral directions and/or downward direction toward a wavelength converting member 3 that is a light-emitting region of the semiconductor device 100.

In the semiconductor device 100, the covering member 2 is disposed on lateral surfaces of the semiconductor elements 1, lateral surfaces of the wavelength converting member 3, and lower surfaces (i. e., electrodes 11 and 12 side) of the semiconductor elements 1 except on lower surfaces of the electrodes 11 and 12. The covering member 2 is also disposed between the electrodes 11 and 12 of each of the semiconductor elements 1, but the lower surfaces of the electrodes 11 and 12 are exposed, not covered by the covering member.

The covering member 2 is, for example, a resin layer containing a light-reflecting material. The covering member 2 may contain a filler material in addition to the light-reflecting material in a resin material that serves as a base material or a binder.

The binder is a resin for binding the light-reflecting material, the filler material, etc., to the semiconductor elements 1 in a form of the covering member 2. Examples of the resin used as the binder include polycarbonate resin, epoxy resin, phenol resin, silicone resin, acrylic resin, TPX resin, polynorbornene resin, and urethane resin. For such resin, modified resin of such resin, hybrid resin which includes one or more of those resins, or the like, can also be used. Among those, silicone resin or modified silicone resin is preferable because it has high heat-resistance and high light-resistance, and exhibits a small volume contraction in solidifying or hardening.

The light-reflecting material is configured to reflect light emitted from the semiconductor elements 1. Examples of the light-reflecting material include silica, titanium oxide, silicon oxide, aluminum oxide, potassium titanate, zinc oxide, and boron nitride. Resin powder such as silicone powder may also be used.

Filler material can be used to enhance mechanical strength of the covering member 2 that is in a shape of a resin layer, to increase thermal conductivity of the covering member, or the like. Examples of the filler material include glass fiber, whisker, aluminum oxide, silicon oxide, boron nitride, zinc oxide, and aluminum nitride.

Wavelength Converting Member

The wavelength converting member 3 is a member containing a wavelength converting material that is configured to absorb a portion of light with certain wavelength emitted from the semiconductor elements 1 and emit light of different wavelength. The wavelength converting material contained in the wavelength converting member 3 is, for example, a fluorescent material. The wavelength converting member 3 is disposed on the light-emitting surfaces of the semiconductor elements 1.

The base material or binder of the wavelength converting member 3 is preferably made of resin having light-transmissive properties. Examples of the resin includes resins that are used for the base material or binder of the covering member as described above. Among those, silicone resin or modified silicone resin is preferable because it has high heat-resistance and high light-resistance, and exhibits a small volume contraction in solidifying or hardening. Other than resin, the base material or binder of the wavelength converting member 3 may be made of glass.

Examples of the fluorescent material contained in the wavelength converting member 3 include yttrium aluminum garnet activated with cerium, lutetium aluminum garnet activated with cerium, terbium aluminum garnet activated with cerium, nitrogen-containing calcium aluminosilicate activated with europium or/and chromium, sialon activated with europium, silicate activated with europium, potassium fluosilicate activated with manganese, and nitride phosphor activated with europium.

Method of Mounting Semiconductor Element

Next, an example of a method of mounting semiconductor elements will be described.

Figure 2:
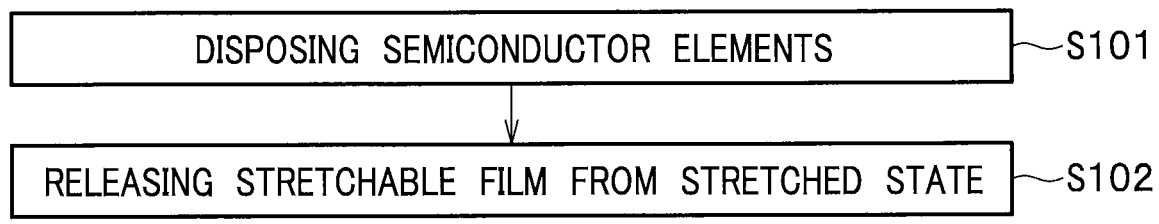
FIG. 2 is a flow chart showing a procedure of a method of mounting semiconductor elements according to the first embodiment.
Figure 3A:
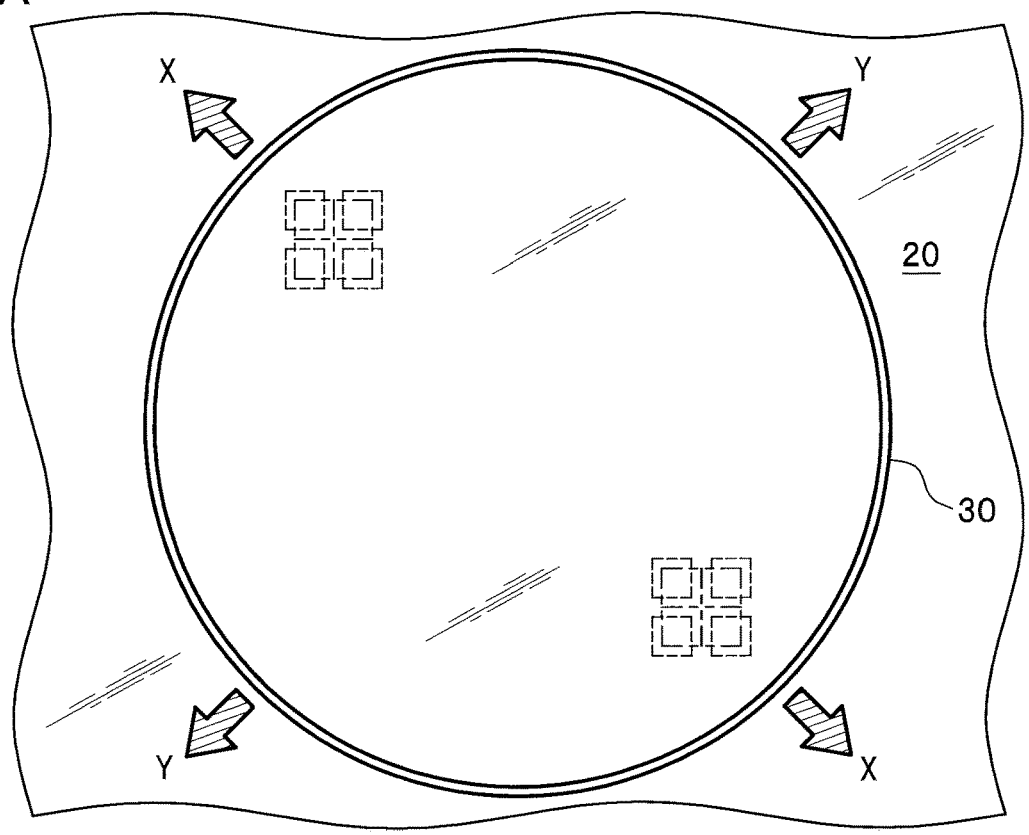
FIG. 3A is a plan view schematically showing a stretched state of a stretchable film that is attached to a fixture and stretched by using the fixture, in disposing semiconductor elements in a method of mounting semiconductor elements according to the first embodiment.
Figure 3B:
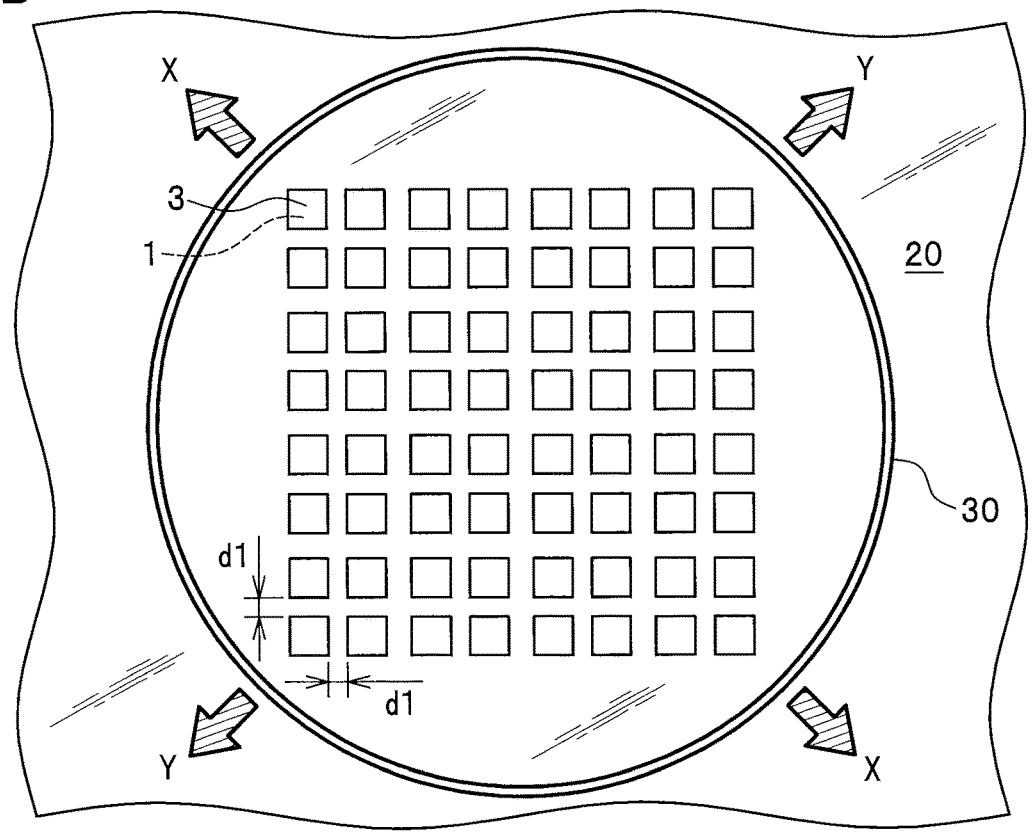
FIG. 3B is a plan view schematically showing the semiconductor elements disposed on the stretchable film in the disposing semiconductor elements in a method of mounting semiconductor elements according to the first embodiment.
Figure 3C:
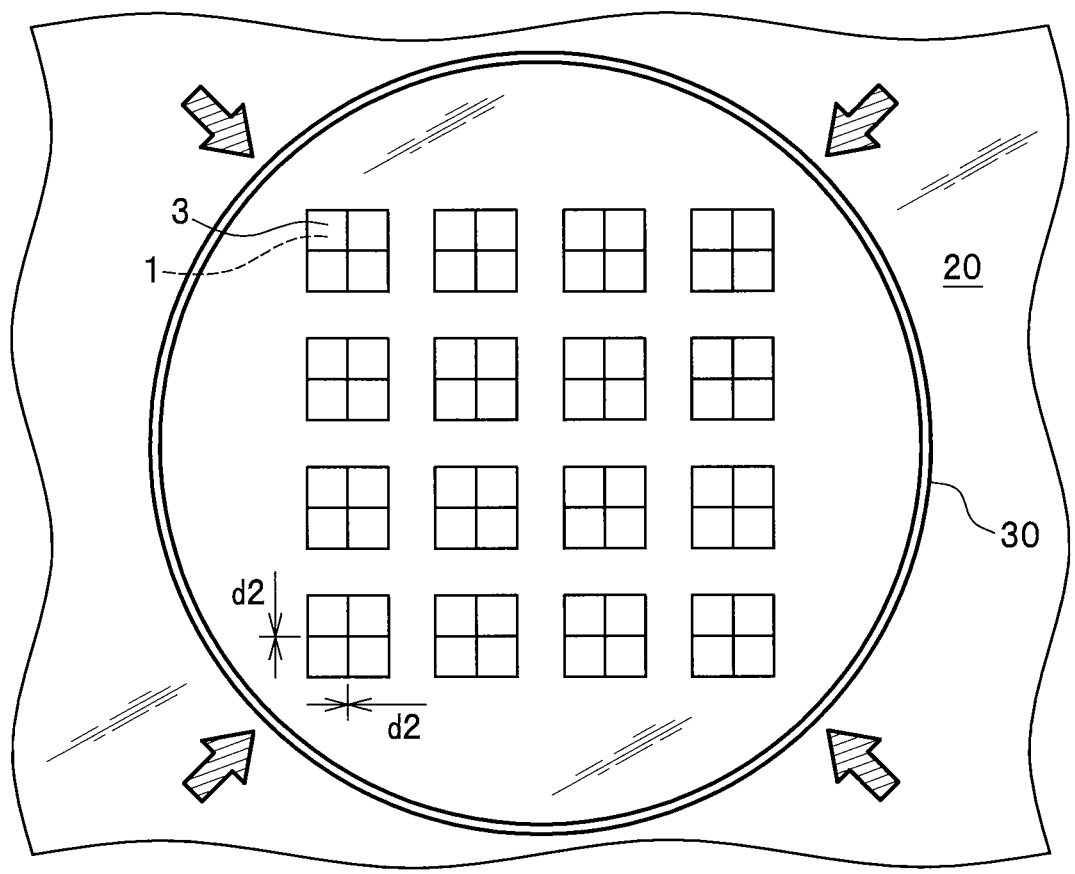
FIG. 3C is a plan view schematically illustrating releasing the stretchable film from its stretched state in a method of mounting semiconductor elements according to the first embodiment.
Figure 4:
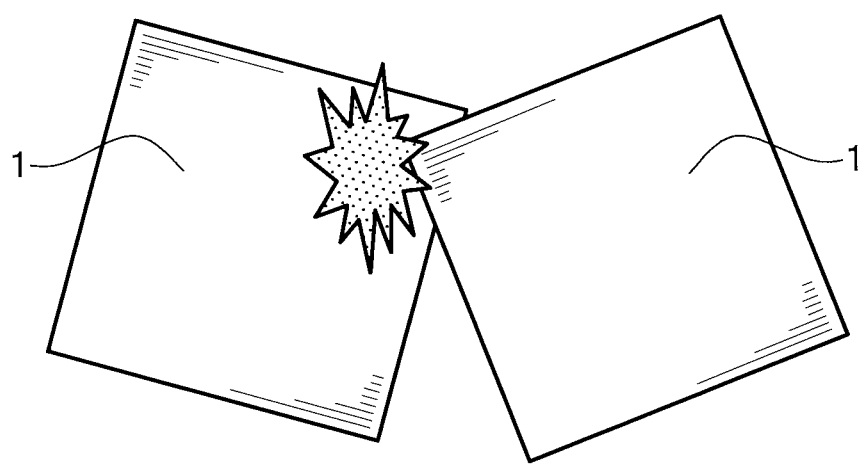
FIG. 4 is a schematic plan view illustrating two adjacent semiconductor elements being in touch with each other at the time of mounting the semiconductor elements on a support substrate when using a conventional technique.
Figure 5A:
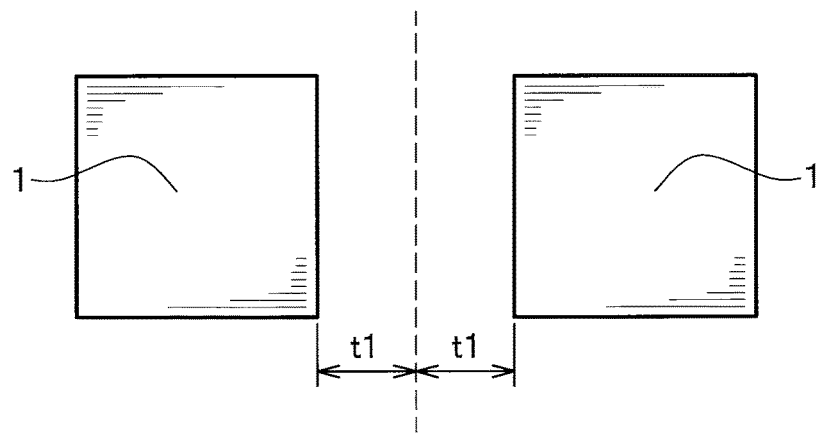
FIG. 5A is a schematic plan view illustrating mounting accuracy at the time of mounting semiconductor elements on a support substrate when using a conventional technique.
Figure 5B:
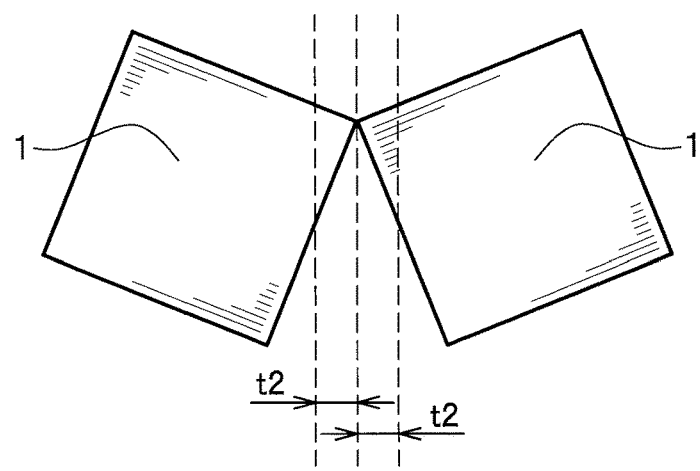
FIG. 5B is a schematic plan view illustrating a θ-rotation at the time of mounting semiconductor elements on a support substrate when using a conventional technique.
Figure 5C:
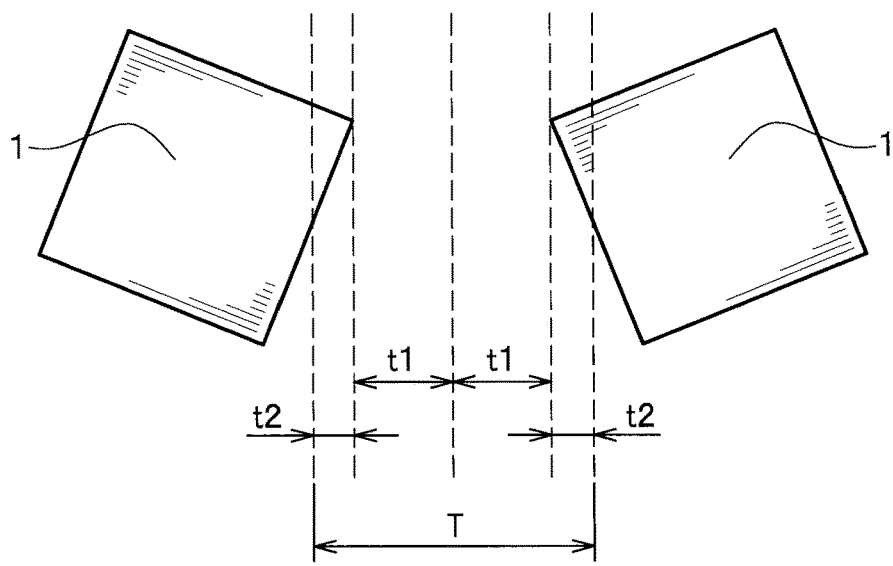
FIG. 5C is a schematic plan view illustrating a minimum clearance at the time of mounting semiconductor elements on a support substrate when using a conventional technique.

FIG. 2 is a flow chart showing a procedure of a method of mounting semiconductor elements according to the first embodiment. FIG. 3A is a plan view schematically showing a stretched state of a stretchable film that is attached to a fixture and stretched by using the fixture, in disposing semiconductor elements in a method of mounting semiconductor elements according to the twelfth embodiment. FIG. 3B is a plan view schematically showing a state in which semiconductor elements have been disposed on a stretchable film in the disposing semiconductor elements in a method of mounting semiconductor elements according to the first embodiment. FIG. 3C is a plan view schematically showing the releasing the stretched state of the stretchable film according to the first embodiment. FIG. 4 is a schematic plan view illustrating two adjacent semiconductor elements being in contact with each other at the time of mounting the semiconductor elements on a support substrate when using a conventional technique. FIG. 5A is a schematic plan view illustrating mounting accuracy at mounting semiconductor elements on a support substrate when using a conventional technique. FIG. 5B is a schematic plan view illustrating a θ-rotation at the time of mounting semiconductor elements on a support substrate when using a conventional technique. FIG. 5C is a schematic plan view illustrating a minimum clearance at the time of mounting semiconductor elements on a support substrate when using a conventional technique.

A method of mounting semiconductor elements includes, successively, disposing semiconductor elements (S101) and releasing stretchable film from stretched state (S102). In the disposing semiconductor elements (S101), a stretchable film 20 is stretched against an elastic force into a stretched state and a plurality of semiconductor elements 1 are disposed in predetermined regions on the stretchable film 20 in the stretched state, each of the predetermined regions to have a predetermined group of semiconductor elements 1 spaced apart from one other at a first distance. In the disposing semiconductor elements (S101), the stretchable film is released from the stretched state by using the elastic force of the stretchable film 20. In the method of mounting semiconductor elements, the first distance (d1) between adjacent semiconductor elements in each of the predetermined regions at the time of disposing the semiconductor elements on the stretchable film in the stretched state is reduced to a predetermined second distance of a mounting distance after releasing the stretched state of the stretchable film.

Each of these operations will be described below. The materials or positional relationship of the members are similar to those in the semiconductor device 100 described above and therefore the description thereof may be appropriately omitted.

Disposing Semiconductor Elements

In the disposing semiconductor elements (S101), a stretchable film is stretched against an elastic force into a stretched state and a plurality of semiconductor elements 1 are disposed in predetermined regions on the stretchable film 20 in the stretched state, each of the predetermined regions to have a predetermined group of semiconductor elements 1 spaced apart from one other on a predetermined region of the stretchable film that is in the stretched state.

In the disposing semiconductor elements (S101), the stretchable film 20 is attached to a fixture 30 and is stretched by using the fixture 30. Alternatively, the stretchable film 20 is stretched into a stretched state and secured to the fixture 30 to maintain the stretched state. In the present embodiment, the stretchable film 20 is determined to be in a stretched state secured to the fixture 30.

In the disposing semiconductor elements (S101), the stretchable film is stretched in four directions of the positive and negative X-directions and the positive and negative Y-directions that are orthogonal to the X-directions.

The stretchable film 20 is stretched in the four directions preferably at the same stretching rate. The same stretching rate in the four directions can facilitate adjusting of the disposing distance (first distance) between adjacent semiconductor elements 1 on the stretchable film 20 in the stretched state, and adjusting of the mounting distance (second distance) between adjacent semiconductor elements 1 after releasing the stretched state of the stretchable film 20, which can facilitate mounting of the semiconductor elements 1. The stretching rate can be appropriately determined in regard to the disposing distance (first distance) of the semiconductor elements 1 in the stretched state of the stretchable film 20 and the mounting distance (second distance) of the semiconductor elements 1 after releasing the stretched state of the stretchable film 20.

When the distance between adjacent semiconductor elements 1 in the semiconductor device 100 is configured to be 200 μm or less, the stretch width of the stretchable film 20 stretched in the opposite two directions is preferably in a range of 50 to 500 μm. When the stretched width is 50 μm or greater, disposing of the semiconductor elements 1 on the stretchable film 20 can be facilitated. Meanwhile, when the stretched width is 500 μm or less, distortion caused in the mounting portion of the semiconductor elements 1 can be reduced or eliminated. The stretched width is more preferably in a range of 50 to 200 μm.

A stretchable film 20 employed herein has a stretching rate sufficient to provide a desired clearance (second distance between adjacent semiconductor elements 1 in each predetermined group) that allows satisfactorily mounting of the semiconductor elements 1. Examples of the material of the stretchable film 20 include UV tapes, various plastic materials, and various rubber materials. The stretchable film 20 has a thickness of, for example, preferably in a range of 10 to 500 μm, more preferably in a range of 20 to 200 μm. The stretching rate of the stretchable film 20 is preferably in a range of 700% or less, more preferably in a range of 500% or less, particularly preferably in a range of 300% or less. When a stretchable film 20 having the stretching rate greater than 500% is used, the semiconductor elements 1 can be arranged at high density. When the stretching rate of a stretchable film 20 is 300% or less, the stretchable film 20 can be used for disposing wiring or the like, and also breakage of the stretchable film 20 can be reduced or prevented.

For the fixture 30, any appropriate fixture known in the art can be used.

In the disposing semiconductor elements (S101), a single group of semiconductor elements 1 includes four semiconductor elements 1 arranged in a matrix of two rows and two columns. Then, a single array including four single groups of the semiconductor elements 1 are arranged in a matrix of four rows and four columns. Thus, 16 single groups are arranged in a matrix, such that 64 semiconductor elements 1 are disposed.

In the disposing semiconductor elements (S101), for example, the semiconductor elements 1 are disposed such that each two adjacent semiconductor elements 1 in each of the single groups are spaced apart from each other at a distance in a range of 50 to 500 μm.

In the present embodiment, the semiconductor elements 1 are disposed on the stretchable film 20 with the respective electrodes 11 and 12 opposite to the stretchable film 20.

Releasing Stretchable Film from Stretched State

In the releasing stretchable film from stretched state (S102), the stretched state of the stretchable film 20 is released by elastic force of the stretchable film 20. In the releasing stretchable film from stretched state (S102), the stretchable film 20 is removed from the fixture 30 that has been maintaining the stretched state of the stretchable film 20, to release the stretched state of the stretchable film 20 by its elastic force.

In the releasing stretchable film from stretched state (S102), the first distance (d1) between two adjacent semiconductor elements 1 at the time of disposing the semiconductor elements 1 is reduced by releasing the stretched state of the stretchable film to a predetermined mounting distance of a second distance (d2). In the first embodiment, the distance of two adjacent semiconductor elements 1 in each of the single groups of four semiconductor elements 1 is reduced to the predetermined mounting distance. Further, in the stretched state, four semiconductor elements 1 disposed at the first distance (d1) may be determined as a single group, and a plurality of the single groups are disposed spaced apart from one other at a distance greater than the first distance (d1). Thus, when the stretched state of the stretchable film 20 is released, single groups each including four semiconductor elements 1 can be spaced apart from one other.

In the releasing stretchable film from stretched state (S102), the mounting distance (second distance d2) of the semiconductor elements 1 in each of the groups on the stretchable film 20 after being released from the stretched state is in a range of 0 to 50 μm.

As described above, using the mounting method of semiconductor elements 1 according to the first embodiment, high density mounting of the semiconductor elements 1 can be achieved. When a conventional technique is used for mounting a plurality of semiconductor elements 1 (i.e., chips) on a substrate, and when a clearance is not provided, θ-rotation of the semiconductor elements 1 may occur as shown in FIG. 4, which may cause the semiconductor elements 1 to contact with each other in a longitudinal direction, hindering the mounting of the semiconductor elements 1.

For this reason, when a conventional technique is used to mount the semiconductor elements 1, consideration of mounting accuracy and clearance for θ-rotation are required. For example, in conditions shown below, a minimum clearance in a range of 66 to 160 μm is required (FIG. 5A to FIG. 5C).

Conditions

Assumed chip size: a square with a side in a range of 100 μm to 2 mm.

(General) Mounting accuracy (t1): ±30 μm, a maximum total 60 μm (General) θ-rotation: ±3°

Deviation (t2) caused by a 3° rotation of 2 mm chip: about 50 μm

Deviation (t2) caused by a 3° rotation of 100 μm chip: about 3 μm

Minimum clearance (T) for 2 mm chip: 30×2+50×2=160 μm

Minimum clearance (T) for 100 μm chip: 30×2+3×2=66 μm

In contrast, in the first embodiment, the plurality of semiconductor elements 1 are disposed in predetermined regions on the stretchable film in the stretched state, each of the predetermined regions to have a predetermined group of semiconductor elements spaced apart from one other, such that the semiconductor elements 1 can be prevented from coming in contact with each other at the time of mounting. Moreover, even if the semiconductor elements 1 are caused to come in contact with each other when the stretched state of the stretchable film 20 is released, the stress generated by contact can be absorbed or released by elasticity of the stretchable film 20, such that damage of the semiconductor elements 1 can be reduced or prevented. Accordingly, a mounting distance can be set smaller than that of a conventional mounting. Even when some degree of wrinkles occurs when the stretched state of the stretchable film 20 is released, the stretchable film 20 will be removed in a process in manufacturing a semiconductor device 100 as described later below, without causing problems.

Method of Manufacturing Semiconductor Device

Next, methods of manufacturing an exemplary light semiconductor device will be described.

Figure 6:
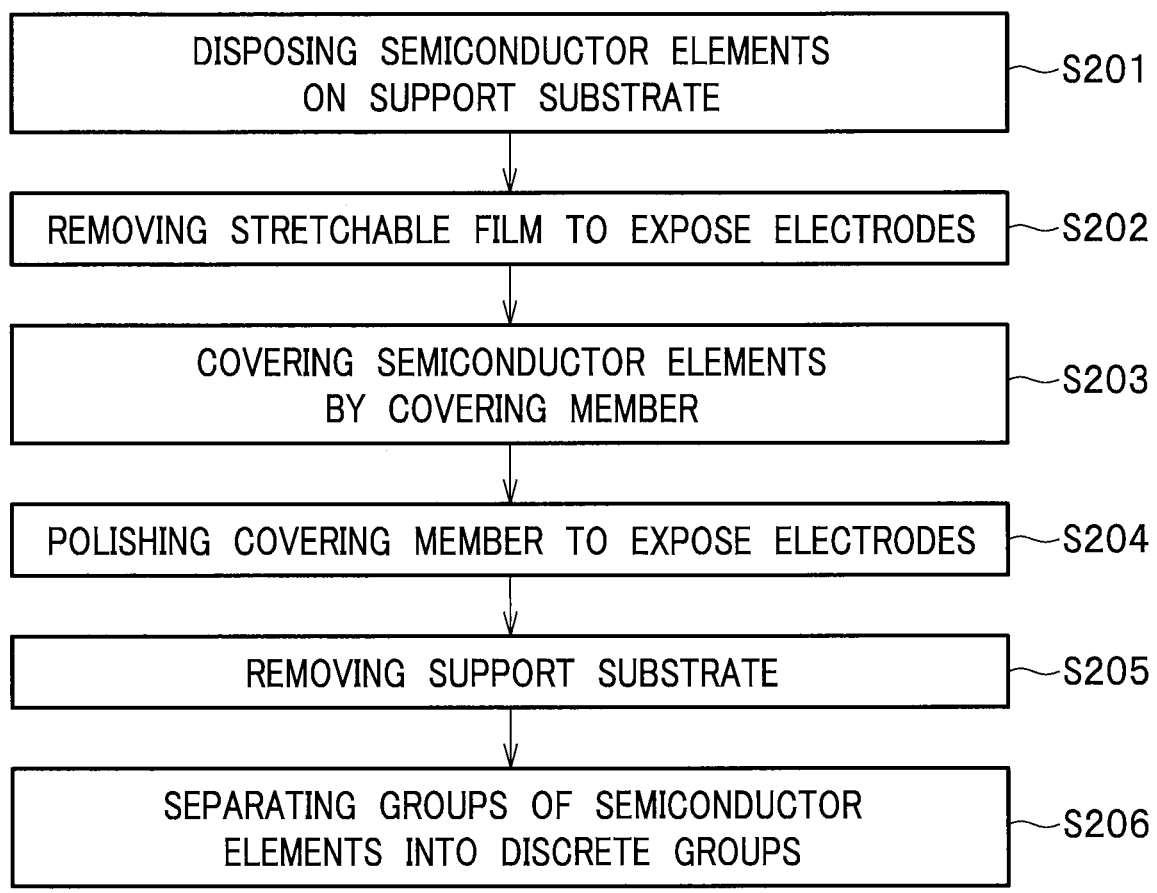
FIG. 6 is a flow chart showing a procedure of a method of manufacturing a semiconductor device according to the first embodiment.
Figure 7A:
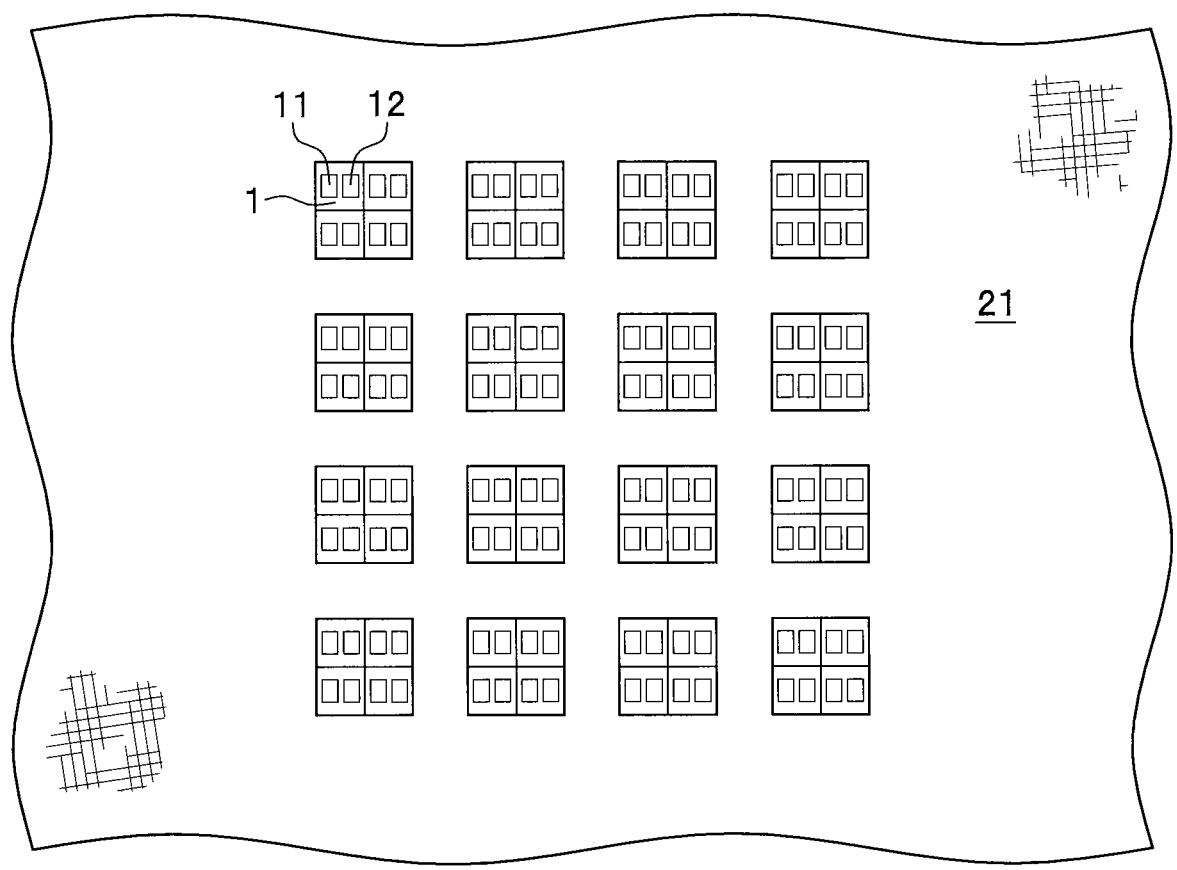
FIG. 7A is a plan view schematically illustrating disposing semiconductor elements on a support substrate and removing a stretchable film to expose electrodes in a method of manufacturing a semiconductor device according to the first embodiment.
Figure 7B:
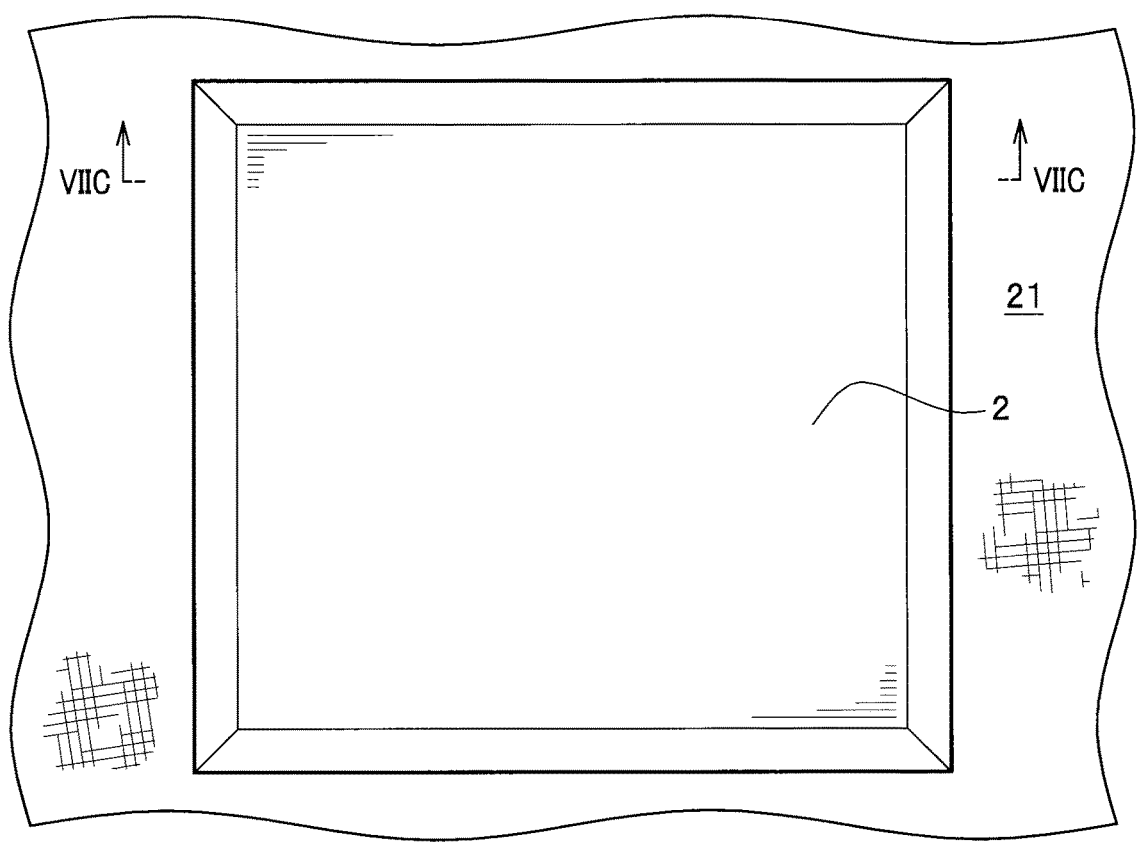
FIG. 7B is a plan view schematically illustrating covering semiconductor elements by a covering member in a method of manufacturing a semiconductor device according to the first embodiment.
Figure 7C:
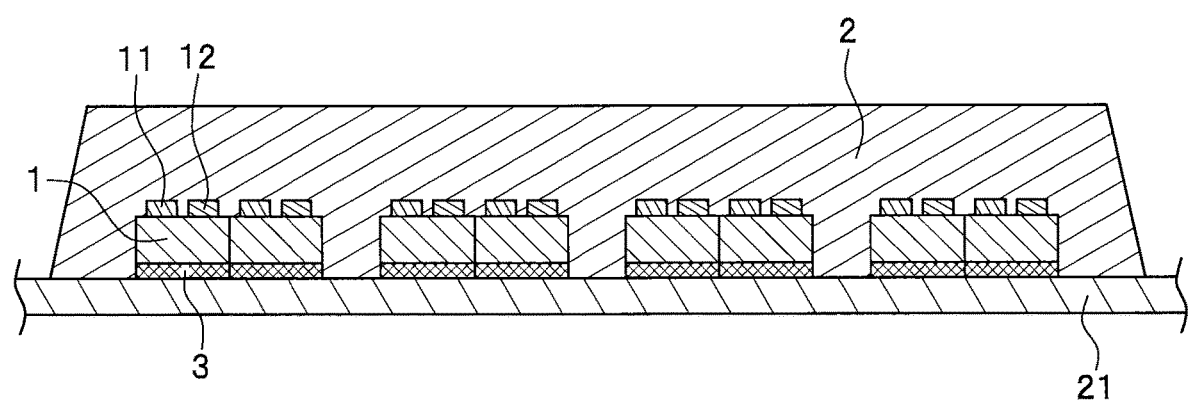
FIG. 7C is a cross-sectional view, taken along line VIIC-VIIC of FIG. 7B, schematically illustrating covering semiconductor elements by covering member in a method of manufacturing a semiconductor device according to the first embodiment.
Figure 7D:
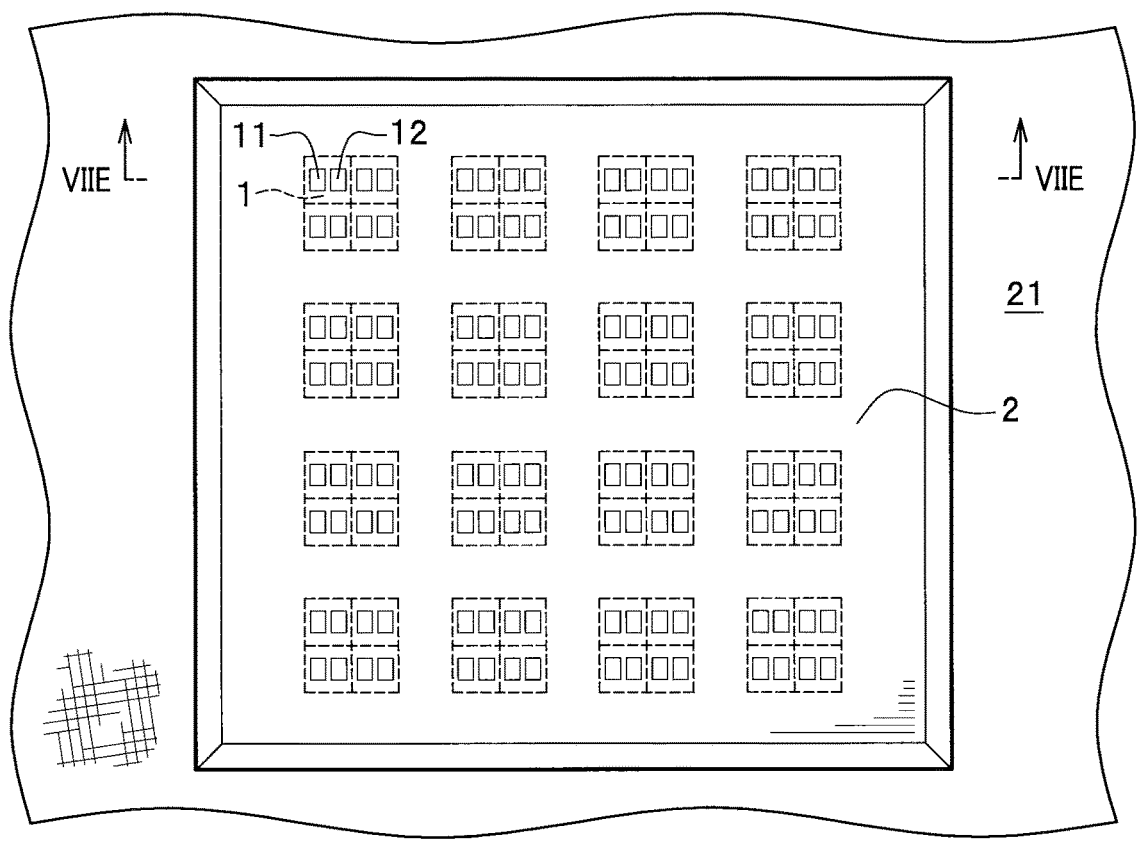
FIG. 7D is a plan view schematically illustrating polishing a cover member to expose electrodes in a method of manufacturing a semiconductor device according to the first embodiment.
Figure 7E:
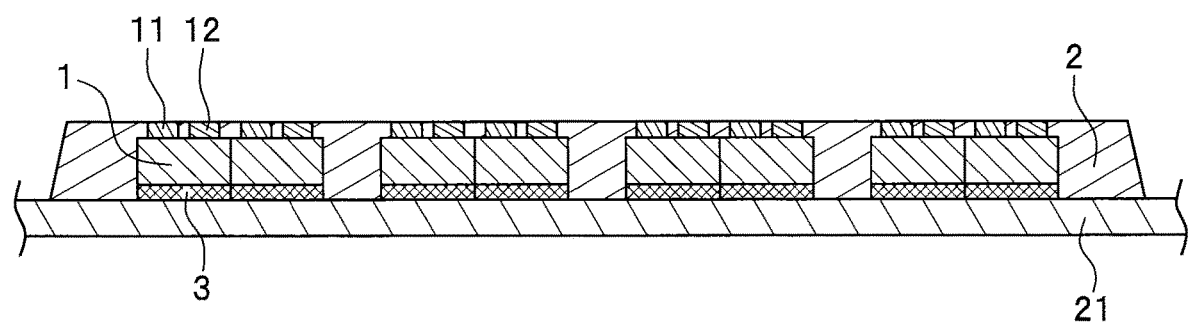
FIG. 7E is a cross-sectional view, taken along line VIIE-VIIE of FIG. 7D, schematically illustrating polishing a cover member to expose electrodes in a method of manufacturing a semiconductor device according to the first embodiment.
Figure 7F:
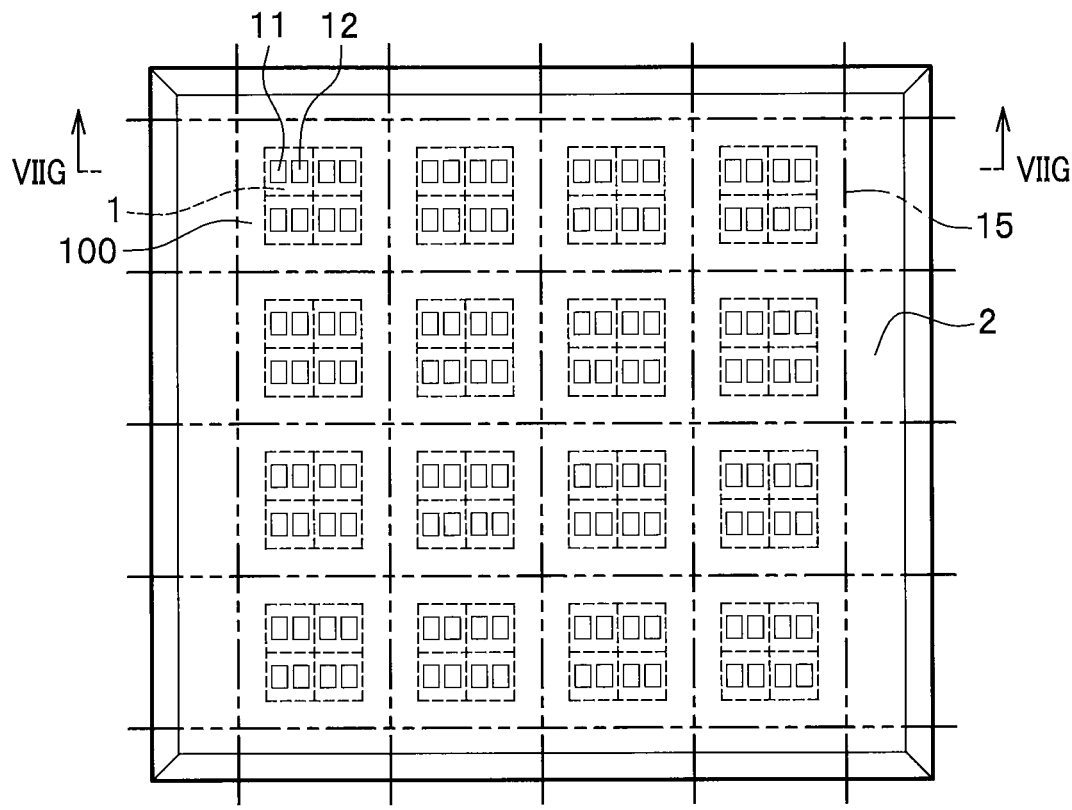
FIG. 7F is a plan view schematically illustrating removing support substrate and separating predetermined groups of semiconductor elements into discrete groups in a method of manufacturing a semiconductor device according to the first embodiment.
Figure 7G:
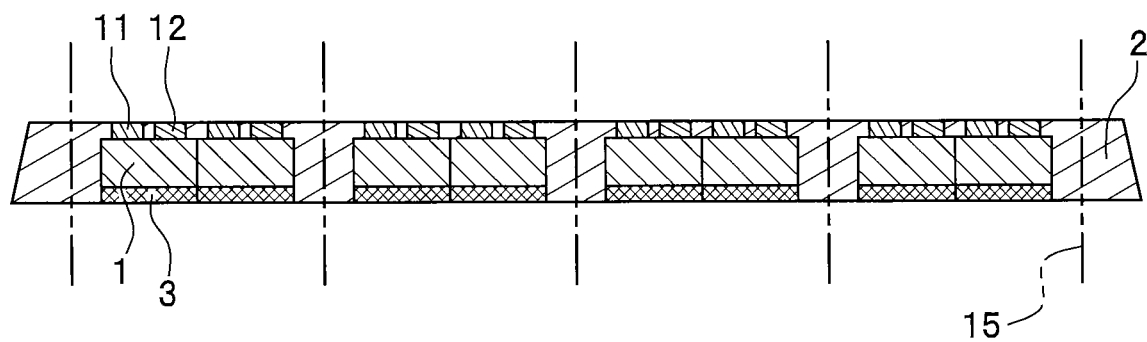
FIG. 7G is a cross-sectional view, taken along line VIIG-VIIG of FIG. 7F, schematically illustrating removing the support substrate and separating predetermined groups of semiconductor elements into discrete groups in a method of manufacturing a semiconductor device according to the first embodiment.

FIG. 6 is a flow chart showing a procedure of a method of manufacturing a semiconductor device according to the first embodiment. FIG. 7A is a plan view schematically illustrating mounting semiconductor elements on a support substrate and removing a stretchable film to expose electrodes in the method of manufacturing a semiconductor device according to the first embodiment. FIG. 7B is a plan view schematically showing the covering semiconductor elements by a covering member in a method of manufacturing a semiconductor device according to the first embodiment. FIG. 7C is a cross-sectional view, taken along line VIIC-VIIC of FIG. 7B, schematically illustrating covering the semiconductor elements by a covering member, in a method of manufacturing a semiconductor device according to the first embodiment. FIG. 7D is a plan view schematically illustrating polishing the covering member to expose electrodes in the method of manufacturing a semiconductor device according to the first embodiment. FIG. 7E is a cross-sectional view, taken along line VIIE-VIIE of FIG. 7D, schematically illustrating polishing the covering member to expose electrodes in a method of manufacturing a semiconductor device according to the first embodiment. FIG. 7F is a plan view schematically illustrating removing support substrate and separating predetermined groups of semiconductor elements into discrete groups in the method of manufacturing a semiconductor device according to the first embodiment. FIG. 7G is a cross-sectional view, taken along line VIIG-VIIG of FIG. 7F, schematically illustrating removing the support substrate and separating predetermined groups of semiconductor elements into discrete groups in a method of manufacturing a semiconductor device according to the first embodiment.

A method of manufacturing a semiconductor device can successively, performing the method of mounting semiconductor elements described above, disposing semiconductor elements on support substrate (S201) in which a plurality of semiconductor elements 1 each having electrodes 11 and 12 are disposed on a support substrate 20 with the electrodes 11 and 12 opposite to the support substrate 20, removing stretchable film to expose electrodes (S202) in which the stretchable film 20 is removed and thus the electrodes 11 and 12 are exposed, covering semiconductor elements by covering member (S203) in which the plurality of semiconductor elements 1 are covered by a covering member such that the electrodes 11 and 12 are covered by the covering member 2, polishing covering member to expose electrodes (S204) in which the covering member 2 is polished to expose the electrodes 11 and 12, removing support substrate (S205), and separating predetermined groups of the semiconductor elements into discrete groups (S206), in which predetermined groups of the semiconductor elements 1 are separated into discrete groups each including a predetermined number of one or more semiconductor elements 1.

Each of these operations will be described below. The materials or positional relationship of the members are similar to those in the semiconductor device 100 described above and therefore the description thereof may be appropriately omitted.

Disposing Semiconductor Elements on Support Substrate

In the disposing the semiconductor elements on support substrate (S201), the semiconductor elements 1 mounted by using the method of mounting according to the first embodiment are disposed on the support substrate 21 such that surfaces of the semiconductor elements opposite from the electrodes 11 and 12 are opposite to the support substrate 21.

In disposing the semiconductor elements on support substrate (S201), in a state disposed on the stretchable film 20, the semiconductor elements 1 are disposed on the support substrate 21 such that the wavelength converting member 3 of each of the semiconductor elements 1 is adhered to the support substrate 21.

For the support substrate 21, for example, a polyimide film, a PET film, or the like, can be used.

The support substrate 21 has a thickness of, for example, preferably in a range of 5 to 300 μm, more preferably in a range of 10 to 150 μm.

Removing Stretchable Film to Expose Electrodes

In removing stretchable film to expose electrodes (S202), the stretchable film 20 is removed and lower surfaces of the electrodes 11 and 12 are exposed.

Covering by Covering Member

In the covering semiconductor elements by covering member (S203), the semiconductor elements 1 are covered by the covering member 2 such that the electrodes 11 and 12 are covered by the covering member 2.

In the covering semiconductor elements by covering member (S203), the entire of each of the semiconductor elements including the electrodes 11 and 12 are covered by the covering member 2. In the present embodiment, the covering member 2 is disposed to cover the upper surfaces of the electrodes 11 and 12.

Covering the semiconductor elements 1 can be performed, for example, by using a discharge device (dispenser) movable in an up-down direction or a transverse direction with respect to the support substrate 21 above a fixed support substrate 21. With the use of a discharge device, the material of the covering member 2 including resin etc., can be applied on the support substrate 21 to cover the semiconductor elements 1.

Covering the semiconductor elements 1 can be performed by using compression molding, transfer molding, or the like.

Polishing Covering Member to Expose Electrodes

In the polishing covering member to expose electrodes (S204), the covering member 2 is polished to expose the electrodes 11 and 12.

In the polishing covering member to expose electrodes (S204), the covering member 2 is polished from its upper surface side to expose the electrodes 11 and 12.

Removing Support Substrate

In the removing support substrate (S205), the support substrate 21 is removed. Separating Predetermined Groups of Semiconductor Elements into Discrete Groups In the separating predetermined groups of semiconductor elements 1 into discrete groups (S206), predetermined groups of semiconductor elements 1 are separated into discrete groups.

In separating predetermined groups of semiconductor elements into discrete groups (S206), a molded product having the electrodes 11 and 12 exposed in the predetermined regions is separated along separation lines 15 into discrete semiconductor devices 100. Separation can be performed by using known techniques such as dicing with a blade.

Accordingly, semiconductor devices 100 each including four semiconductor elements 1 can be obtained.

Second Embodiment

Next, an example of a method of manufacturing a light-emitting device according a second embodiment will be described. A method of mounting semiconductor elements according to the second embodiment is similar to the method of mounting the semiconductor elements according to the first embodiment and therefore the description thereof will be appropriately omitted.

Figure 8A:
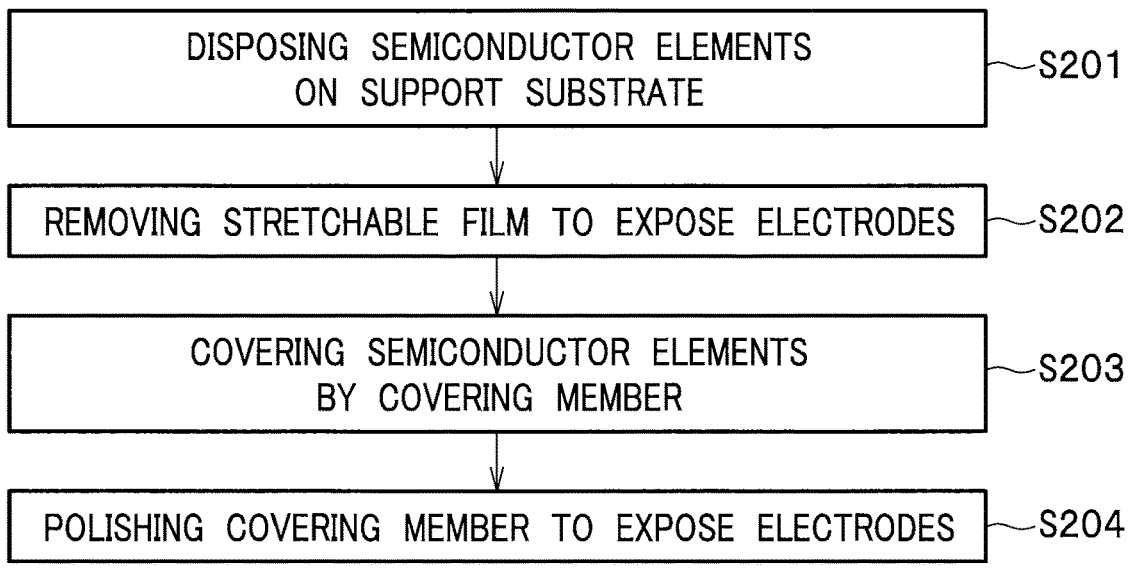
FIG. 8A is a flow chart showing a procedure of a method of manufacturing a semiconductor device according to a second embodiment.

FIG. 8A is a flow chart showing a procedure of a method of manufacturing a semiconductor device according to the second embodiment.

The method of manufacturing a light source device according to the second embodiment, the method includes, successively, mounting semiconductor elements on a support substrate (S201), removing a stretchable film to expose electrodes (S202), covering by a covering member (S203), and polishing covering member to expose electrodes (S204), which are described in the method of manufacturing a light source device according to the first embodiment, and are performed in this order. That is, as shown in FIG. 7E, an obtained semiconductor device includes the support substrate 211 and not to be subject to the separation.

Third Embodiment

Next, an example of a method of manufacturing a semiconductor device according to a third embodiment will be described. The method of mounting semiconductor elements according to the third embodiment is similar to the method of mounting the semiconductor elements according to the first embodiment and therefore the description thereof will be appropriately omitted.

Figure 8B:
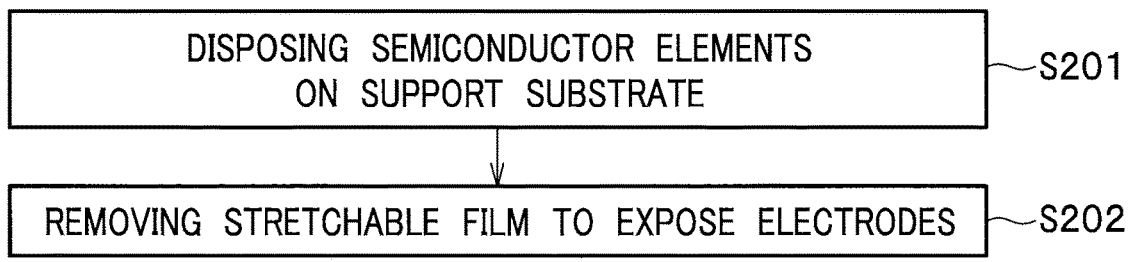
FIG. 8B is a flow chart showing a procedure of a method of manufacturing a semiconductor device according to a third embodiment.

FIG. 8B is a flow chart showing a procedure of a method of manufacturing a semiconductor device according to the third embodiment.

The method of manufacturing a semiconductor device according to the third embodiment includes, successively, the mounting on support substrate (S201), and the removing stretchable film to expose electrodes (S202) described in the method of manufacturing a semiconductor device according to the first embodiment. That is, as shown in FIG. 7A, an obtained semiconductor device includes the support substrate 21 and does not include the covering member 2 and has not been subjected to the separation.

Fourth Embodiment

Next, an example of a method of manufacturing a semiconductor device according to of a fourth embodiment will be described. A method of mounting semiconductor elements according to the fourth embodiment is similar to the method of mounting the semiconductor elements according to the first embodiment and therefore the description thereof will be appropriately omitted.

Figure 9:
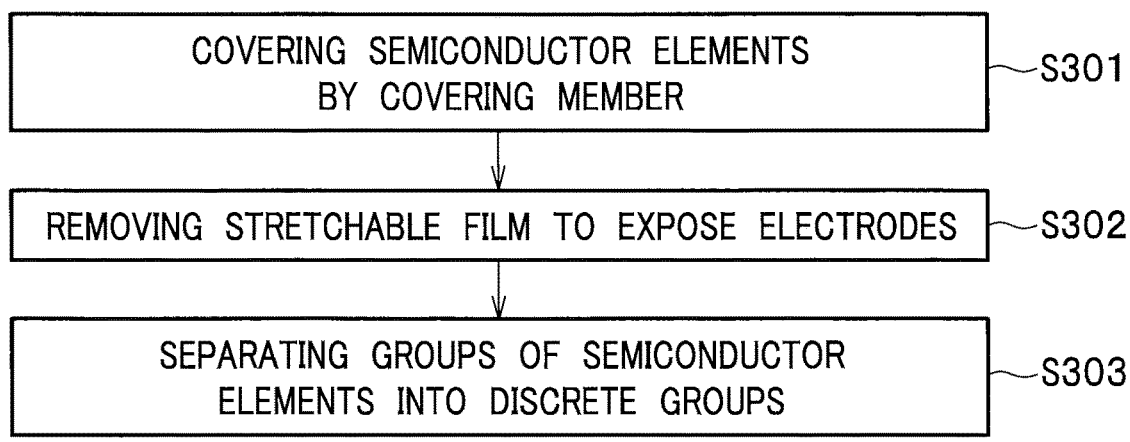
FIG. 9 is a flow chart showing a procedure of a method of manufacturing a semiconductor device according to a fourth embodiment.
Figure 10A:
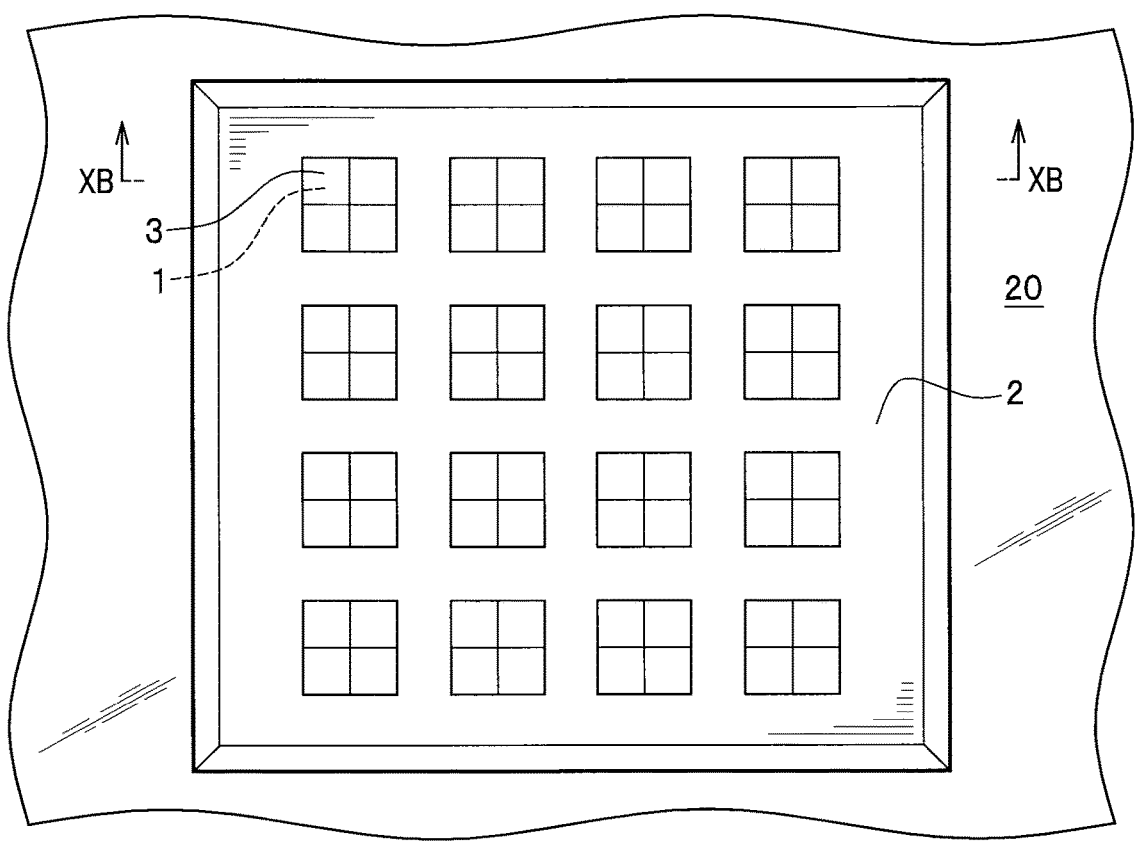
FIG. 10A is a plan view schematically illustrating covering semiconductor elements by a covering member in a method of manufacturing a semiconductor device according to the fourth embodiment.
Figure 10B:
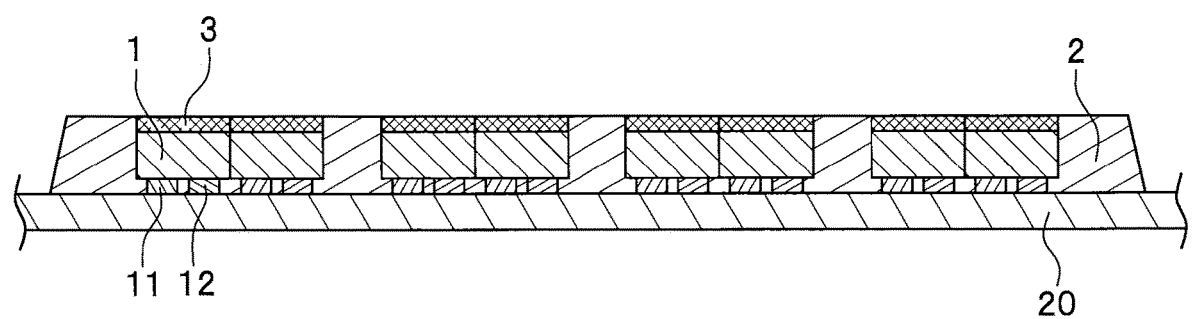
FIG. 10B is a cross-sectional view, taken along line XB-XB of FIG. 10A, schematically illustrating covering the semiconductor elements by a covering member in a method of manufacturing a semiconductor device according to the fourth embodiment.
Figure 10C:
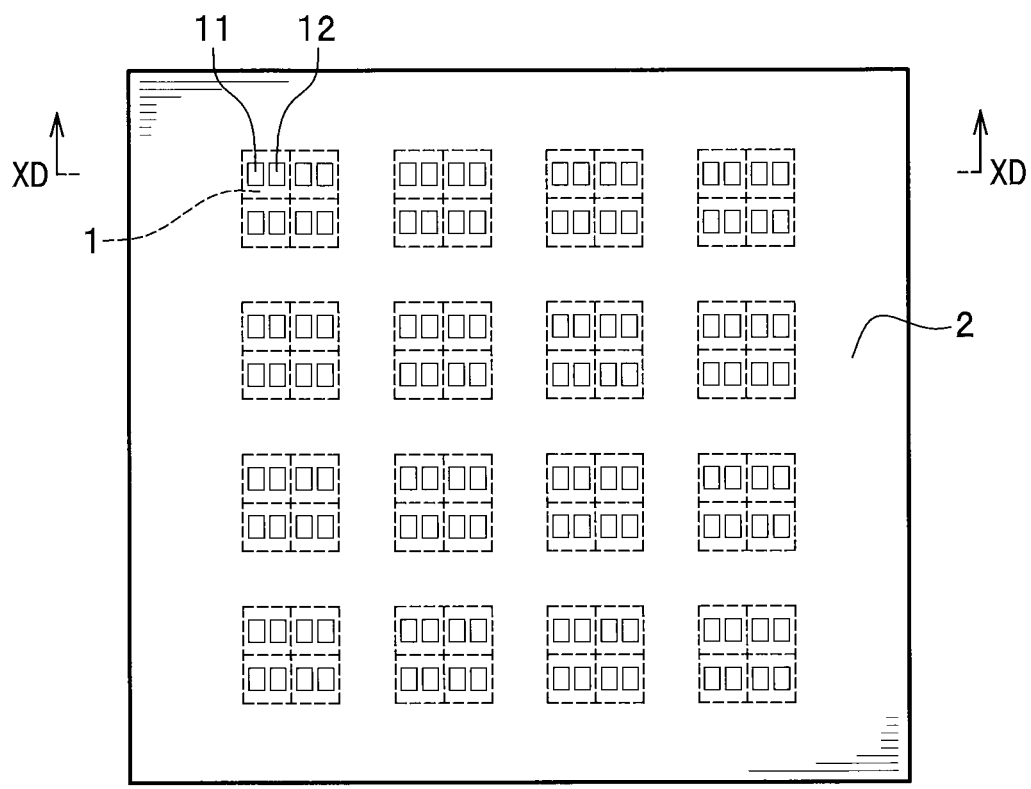
FIG. 10C is a plan view schematically illustrating removing a stretchable film to expose electrodes in the method of manufacturing a semiconductor device according to the fourth embodiment.
Figure 10D:
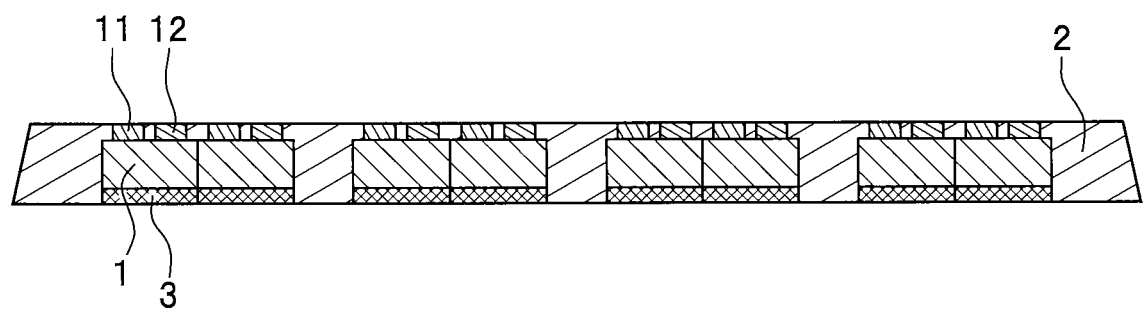
FIG. 10D is a cross-sectional view, taken along line XD-XD of FIG. 10C, schematically illustrating removing a stretchable film to expose electrodes in a method of manufacturing a semiconductor device according to the fourth embodiment.
Figure 10E:
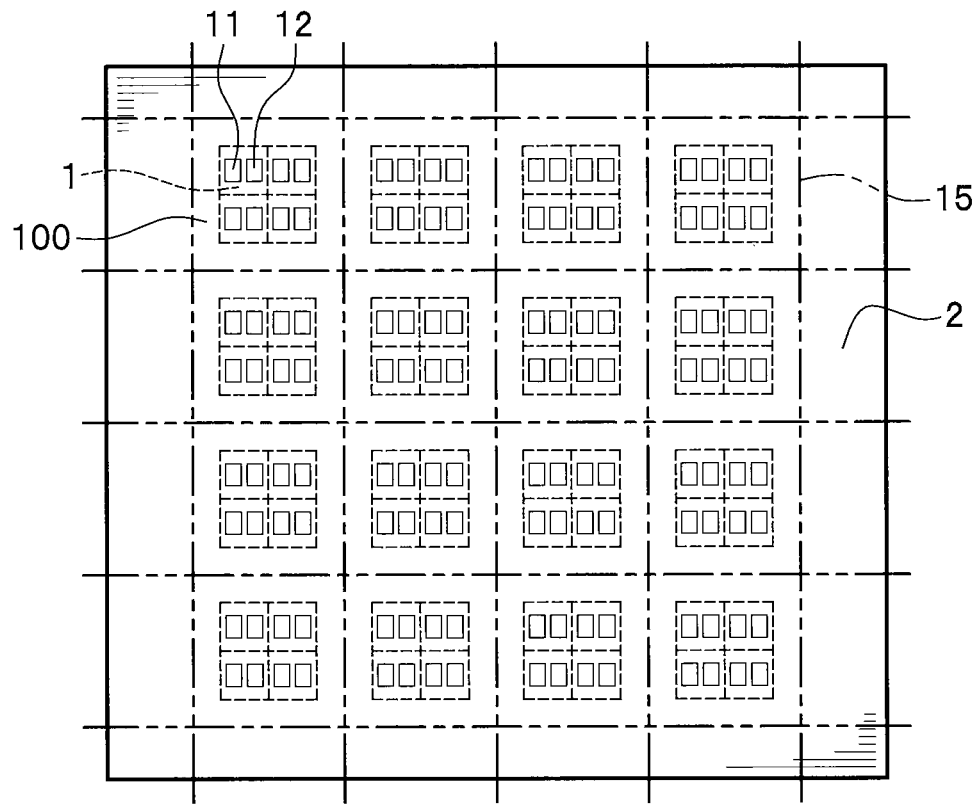
FIG. 10E is a plan view schematically illustrating separating predetermined groups of semiconductor elements into discrete groups in a method of manufacturing a semiconductor device according to the fourth embodiment.

FIG. 9 is a flowchart showing a method of manufacturing a semiconductor device according to the fourth embodiment. FIG. 10A is a plan view schematically illustrating covering semiconductor elements by a covering member in a method of manufacturing a semiconductor device according to the fourth embodiment. FIG. 10B is a cross-sectional view, taken along line XB-XB of FIG. 10A, schematically illustrating covering the semiconductor elements by a covering member in a method of manufacturing a semiconductor device according to the fourth embodiment. FIG. 10C is a plan view schematically illustrating removing a stretchable film to expose electrodes in the method of manufacturing a semiconductor device according to the fourth embodiment. FIG. 10D is a cross-sectional view, taken along line XD-XD of FIG. 10C, schematically illustrating removing a stretchable film to expose electrodes in a method of manufacturing a semiconductor device according to the fourth embodiment. FIG. 10E is a plan view schematically illustrating separating into predetermined groups of semiconductor elements in the method of manufacturing a semiconductor device according to the fourth embodiment.

A method of manufacturing a semiconductor device can include performing the method of mounting semiconductor elements described above; covering semiconductor elements by covering member (S301) in which the semiconductor elements 1 are covered by the covering member 2, removing stretchable film to expose electrodes (S302) in which the stretchable film 20 is removed to expose the electrodes 11 and 12, and separating predetermined groups of semiconductor elements into discrete groups (S303) in which predetermined groups of semiconductor elements are separated into discrete groups each including a predetermined number of one or more semiconductor elements.

Each of these operations will be described below. The materials or positional relationship of the members are similar to those in the semiconductor device 100 described above and therefore the description thereof may be appropriately omitted.

Covering Semiconductor Elements by Covering Member

In the covering semiconductor elements by covering member (S301), the semiconductor elements 1 are covered by the covering member 2 such that the electrodes 11 and 12 are covered by the covering member 2.

In the covering semiconductor elements by covering member (S301), the covering member 2 is disposed on the stretched stretchable film 20 to cover lateral surfaces of the semiconductor elements 1. Covering the semiconductor elements 1 can be performed similarly to the method of manufacturing a semiconductor device according to the first embodiment. When an upper surface of the wavelength converting member 3 is covered by the covering member 2, the wavelength converting member 3 can be exposed by removing a portion of the covering member 2 by polishing or the like.

Removing Stretchable Film to Expose Electrodes

In the removing stretchable film to expose electrodes (S302), the stretchable film 20 is removed and lower surfaces of the first and second electrodes 11 and 12 are exposed. In FIG. 10C and FIG. 10D, the electrodes 11 and 12 side is the upper surface side.

Separating Groups of Semiconductor Elements into Discrete Groups

In the separating groups of semiconductor elements into discrete groups (S303), predetermined groups of the semiconductor elements 1 are separated into discrete groups. Separating the predetermined groups of the semiconductor elements into predetermined groups can be performed similarly to the method of manufacturing a semiconductor device according to the first embodiment.

Accordingly, semiconductor devices 100 each including four semiconductor elements 1 can be obtained.

Fifth Embodiment

Next, an example of a method of manufacturing light semiconductor device according to a fifth embodiment will be described. The method of mounting semiconductor elements according to the fifth embodiment is similar to the method of mounting the semiconductor elements according to the first embodiment and therefore the description thereof will be appropriately omitted.

Figure 11:
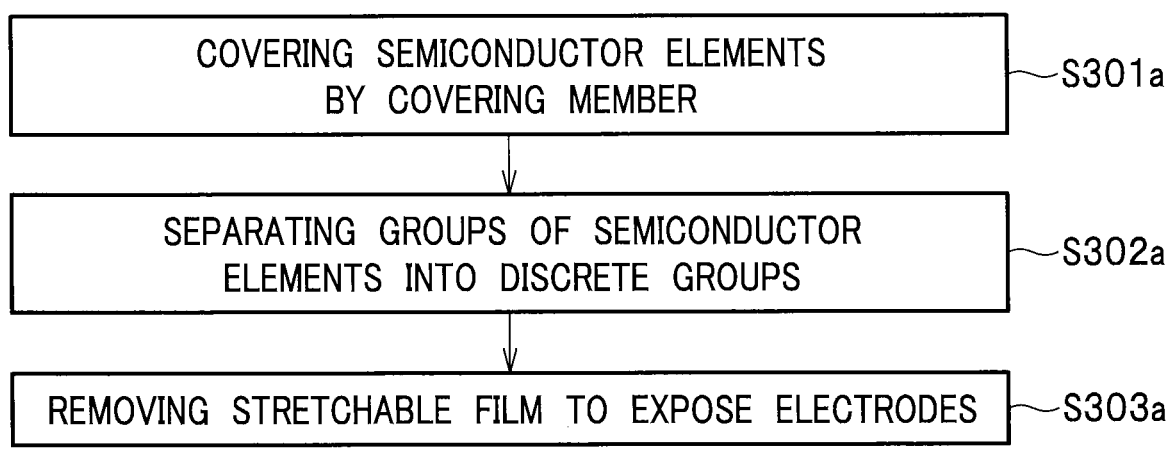
FIG. 11 is a flow chart showing a procedure of a method of manufacturing a semiconductor device according to a fifth embodiment.
Figure 12A:
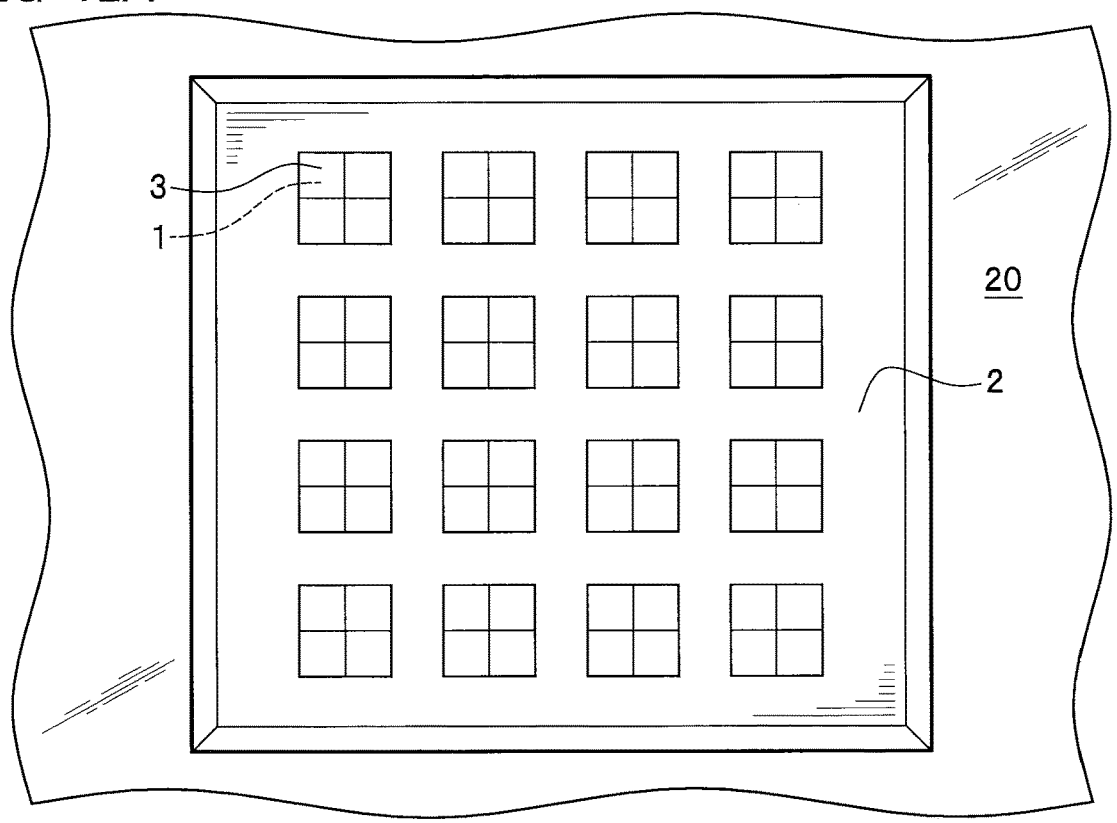
FIG. 12A is a plan view schematically illustrating covering semiconductor elements by a covering member in a method of manufacturing a semiconductor device according to the fifth embodiment.
Figure 12B:
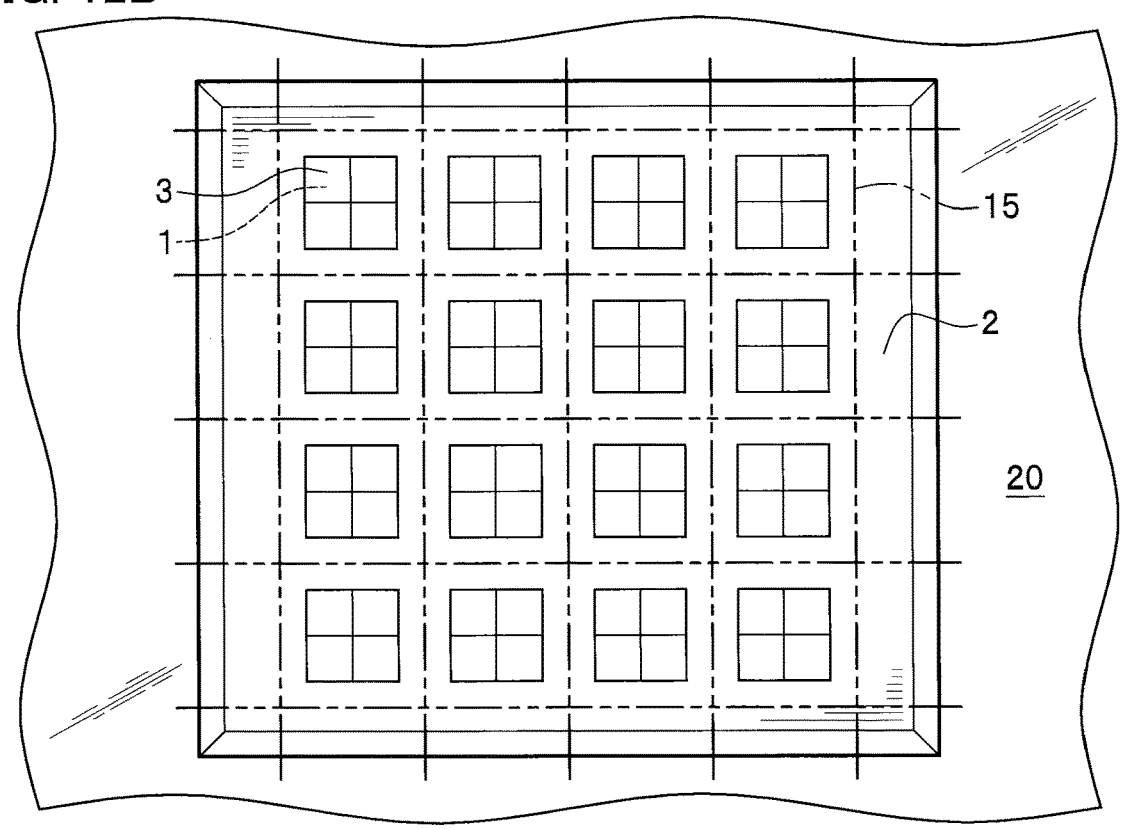
FIG. 12B is a plan view schematically illustrating separating predetermined groups of semiconductor elements into discrete groups in a method of manufacturing a semiconductor device according to the fifth embodiment.
Figure 12C:
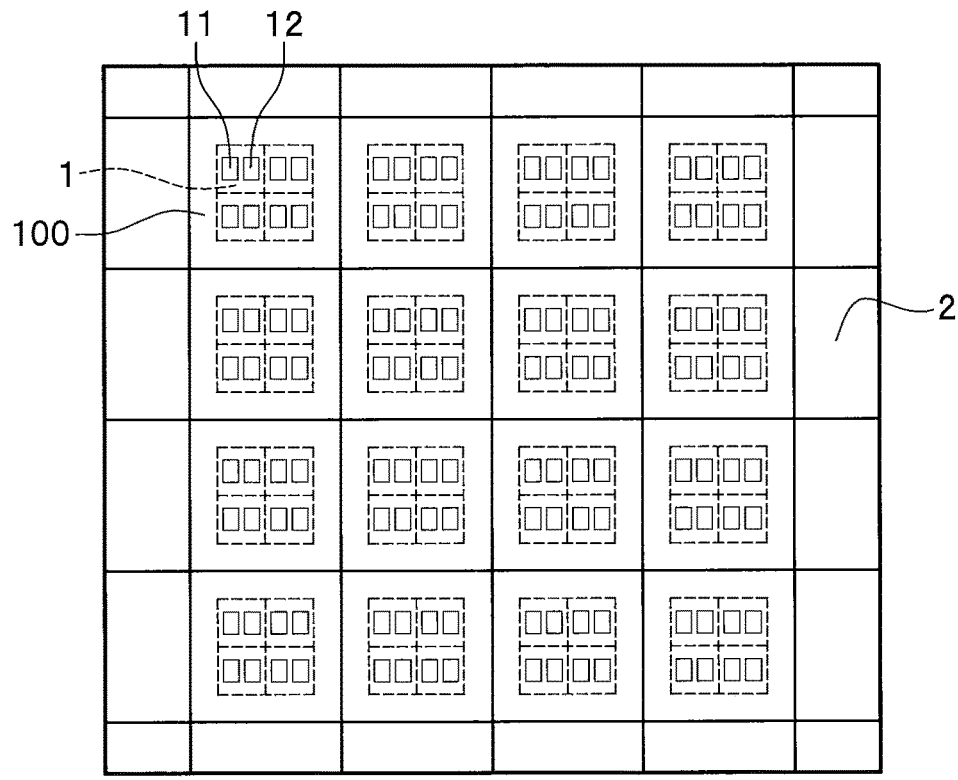
FIG. 12C is a plan view schematically illustrating removing a stretchable film to expose electrodes in a method of manufacturing a semiconductor device according to the fifth embodiment.

FIG. 11 is a flow chart showing a procedure of a method of manufacturing a semiconductor device according to the fifth embodiment. FIG. 12A is a plan view schematically illustrating covering semiconductor elements by a covering member in a method of manufacturing a semiconductor device according to the fifth embodiment. FIG. 12B is a plan view schematically illustrating separating semiconductor elements into predetermined groups in a method of manufacturing a semiconductor device according to the fifth embodiment. FIG. 12C is a plan view schematically illustrating removing a stretchable film to expose electrodes in the method of manufacturing a semiconductor device according to the fifth embodiment.

The method of manufacturing a semiconductor device according to the fifth embodiment can include performing the method of mounting semiconductor elements according to the first embodiment; covering semiconductor elements by covering member (S301a) in which the semiconductor elements 1 are covered by a covering member 2, separating groups of semiconductor elements into discrete groups (S302a) in which predetermined groups of semiconductor elements 1 are separated into discrete groups each including a predetermined number of one or more semiconductor elements 1, and removing stretchable film to expose electrodes (S303a) in which the stretchable film 20 is removed to expose the electrodes 11 and 12.

In the method of manufacturing a semiconductor device according to the fifth embodiment, the separating groups of semiconductor elements into discrete groups (S303) is performed prior to the removing a stretchable film to expose electrodes (S302) in the method of manufacturing a semiconductor device according to the fourth embodiment. The method of manufacturing the light emitting device according to the fifth embodiment can be performed in a similar manner as in the method of manufacturing the light semiconductor device according to the fourth embodiment, except for those described above.

In the separating groups of semiconductor elements into discrete groups (S302a), the stretchable film 20 may be separated or may not be separated.

Sixth Embodiment

Next, an example of a method of manufacturing a semiconductor device according to a sixth embodiment will be described. A method of mounting semiconductor elements according to the sixth embodiment is similar to the method of mounting the semiconductor elements according to the first embodiment and therefore the description thereof will be appropriately omitted.

Figure 13:
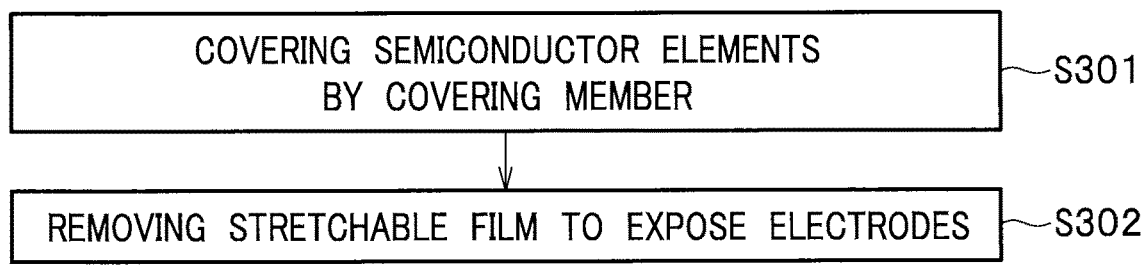
FIG. 13 is a flow chart showing a procedure of a method of manufacturing a semiconductor device according to a sixth embodiment.

FIG. 13 is a flow chart showing a procedure of a method of manufacturing a semiconductor device according to the sixth embodiment.

The method of manufacturing a semiconductor device according to the sixth embodiment can include covering semiconductor elements by a covering member (S301) in which the plurality of semiconductor elements 1 are covered by the covering member 2, and removing stretchable film to expose electrodes (S302) in which the stretchable film 20 is removed to expose electrodes 11 and 12, which are described in the method of manufacturing a semiconductor device according to the fourth embodiment. That is, as shown in FIG. 10B, an obtained semiconductor device has not been subject to the separation.

Seventh Embodiment

Next, an example of method of mounting semiconductor elements and an example of method of manufacturing a semiconductor device according to a seventh embodiment will be described.

Method of Mounting Semiconductor Elements

Figure 14:
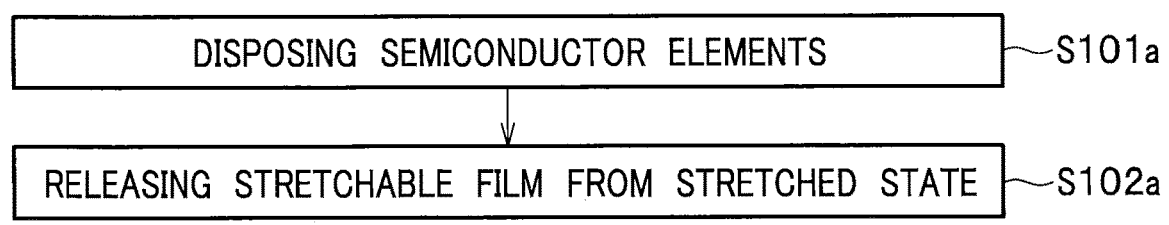
FIG. 14 is a flow chart showing a procedure of a method of mounting semiconductor elements according to a seventh embodiment.
Figure 15A:
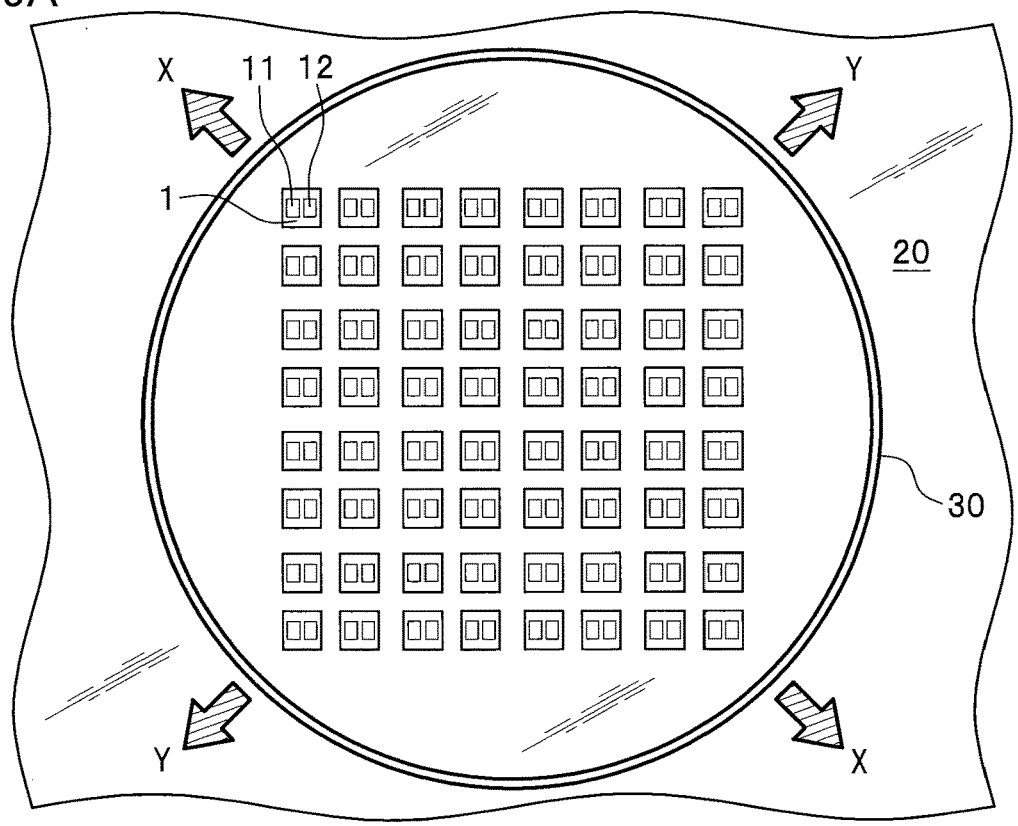
FIG. 15A is a plan view schematically showing a state of semiconductor elements disposed on a stretchable film, in disposing semiconductor elements in a method of mounting semiconductor elements according to the seventh embodiment.
Figure 15B:
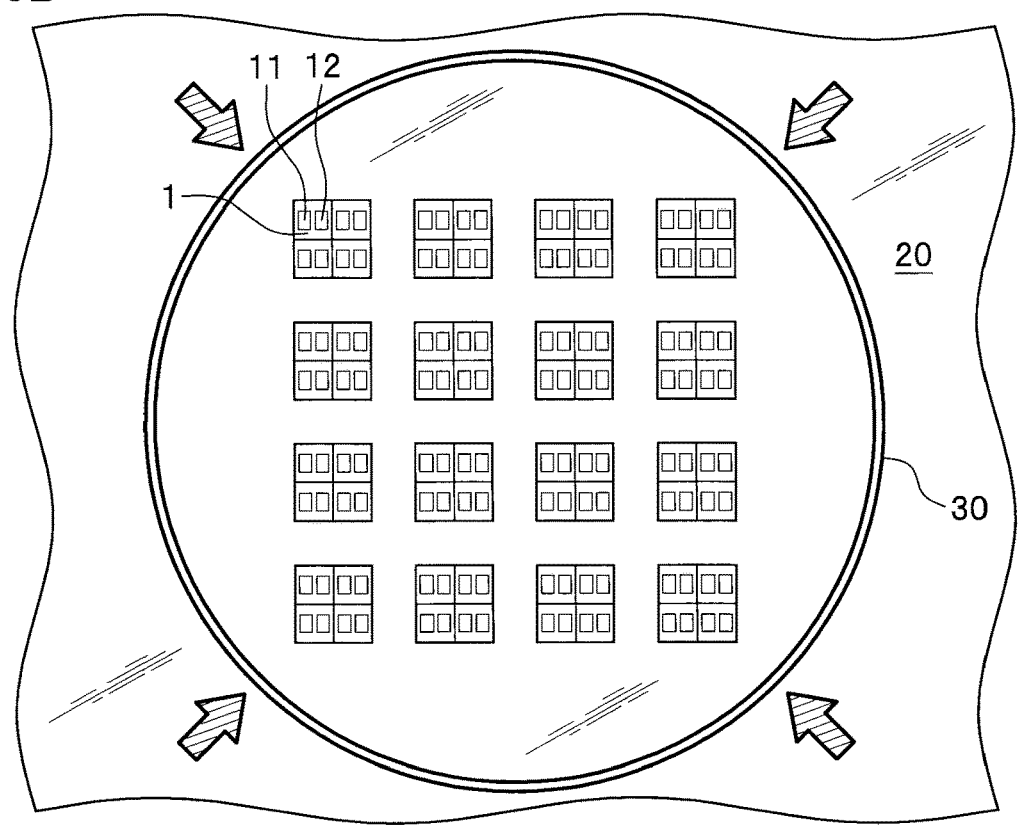
FIG. 15B is a plan view schematically illustrating releasing stretchable film from stretched state in a method of mounting semiconductor elements according to the seventh embodiment.

FIG. 14 is a flow chart showing a procedure of a method of mounting semiconductor elements according to a seventh embodiment. FIG. 15A is a plan view schematically showing a stretched state of a stretchable film that is attached to a fixture and stretched by using the fixture, in the disposing semiconductor elements in a method of mounting semiconductor elements according to the seventh embodiment. FIG. 15B is a plan view schematically illustrating releasing stretchable film from stretched state in a method of mounting semiconductor elements according to the seventh embodiment.

The method of mounting semiconductor elements according to the seventh embodiment can include disposing semiconductor elements (S101a) in which the plurality of semiconductor elements 1 are disposed on a stretchable film 20 such that a surface of each of the semiconductor elements 1 opposite from a surface having electrodes 11 and 12 are opposite to the stretchable film 20, and releasing stretchable film from stretched state (S102a) in which the stretchable film 20 is released from the stretched state by using the elastic force of the stretchable film 20.

In the method of mounting semiconductor elements according to the seventh embodiment, the semiconductor elements 1 are disposed on the stretchable film 20 with the wavelength converting members 3 of the semiconductor elements 1 are respectively adhered to the stretchable film 20. The method of mounting the semiconductor elements according to the seventh embodiment is similar to the method of mounting the semiconductor elements in the first embodiment except for those described above.

Method of Manufacturing Semiconductor Device

Figure 16:
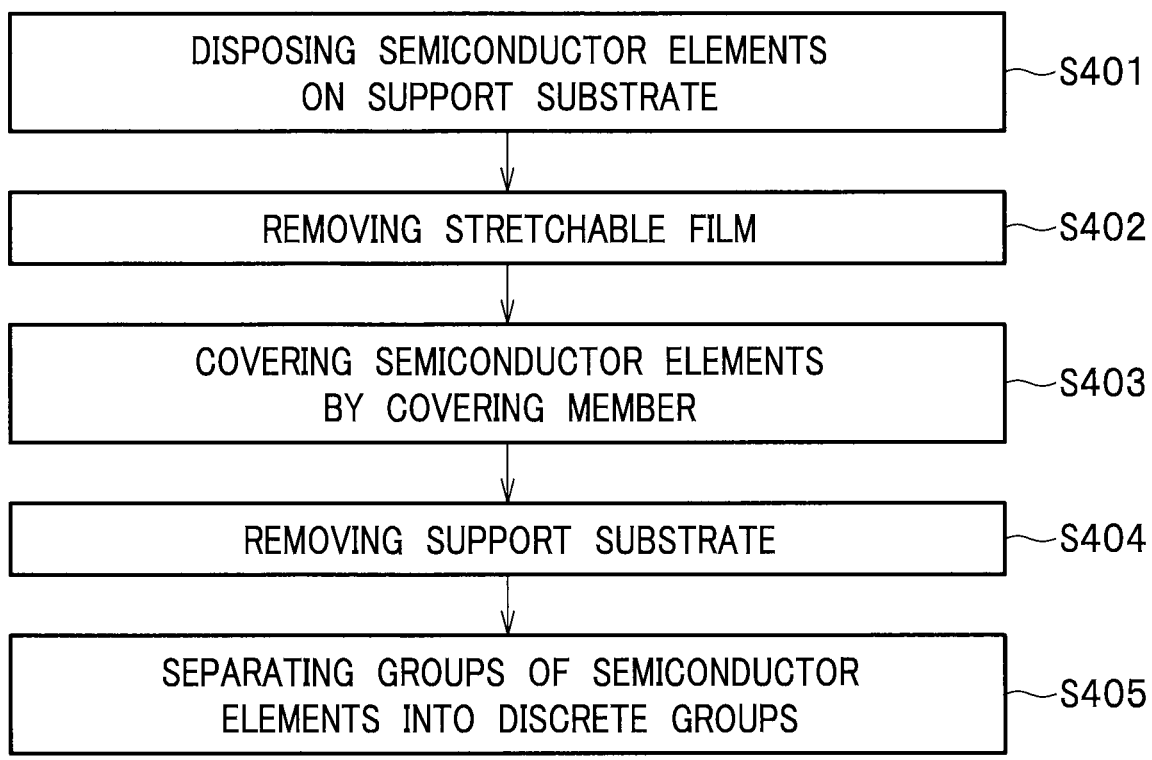
FIG. 16 is a flow chart showing a procedure of a method of manufacturing a semiconductor device according to the seventh embodiment.
Figure 17A:
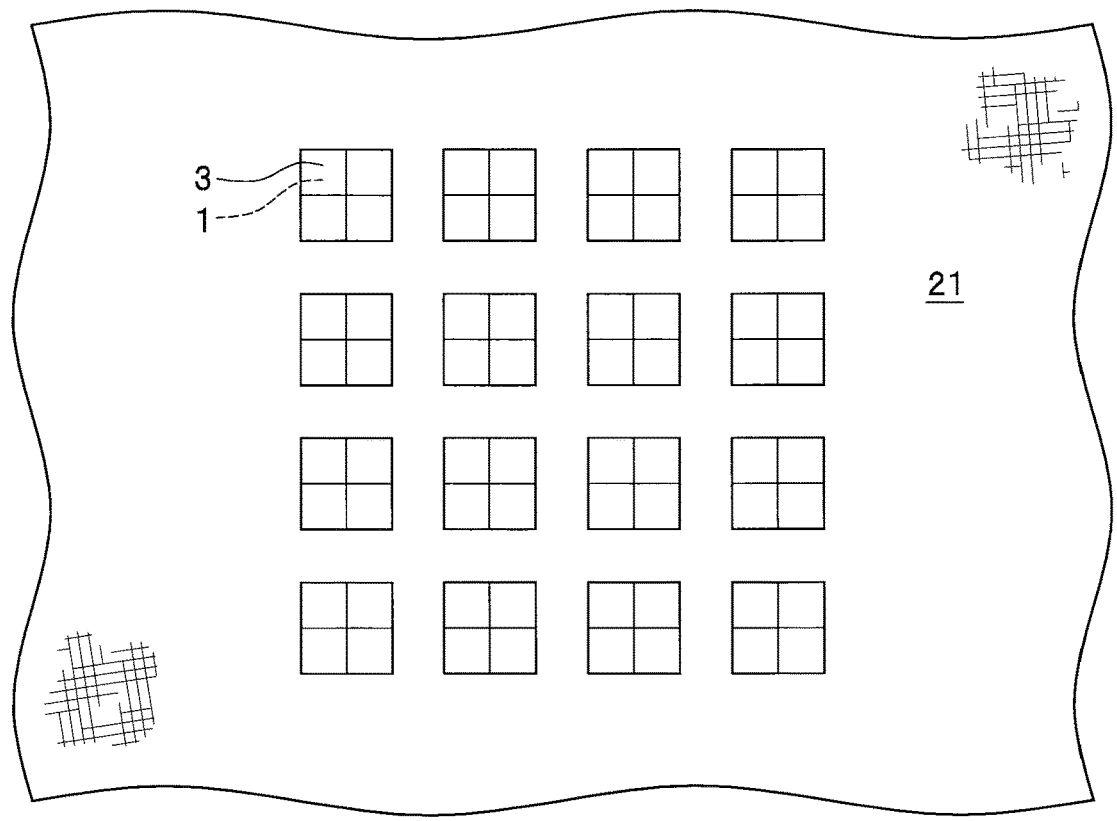
FIG. 17A is a plan view schematically illustrating disposing semiconductor elements on a support substrate and removing a stretchable film in a method of mounting semiconductor elements according to the seventh embodiment.
Figure 17B:
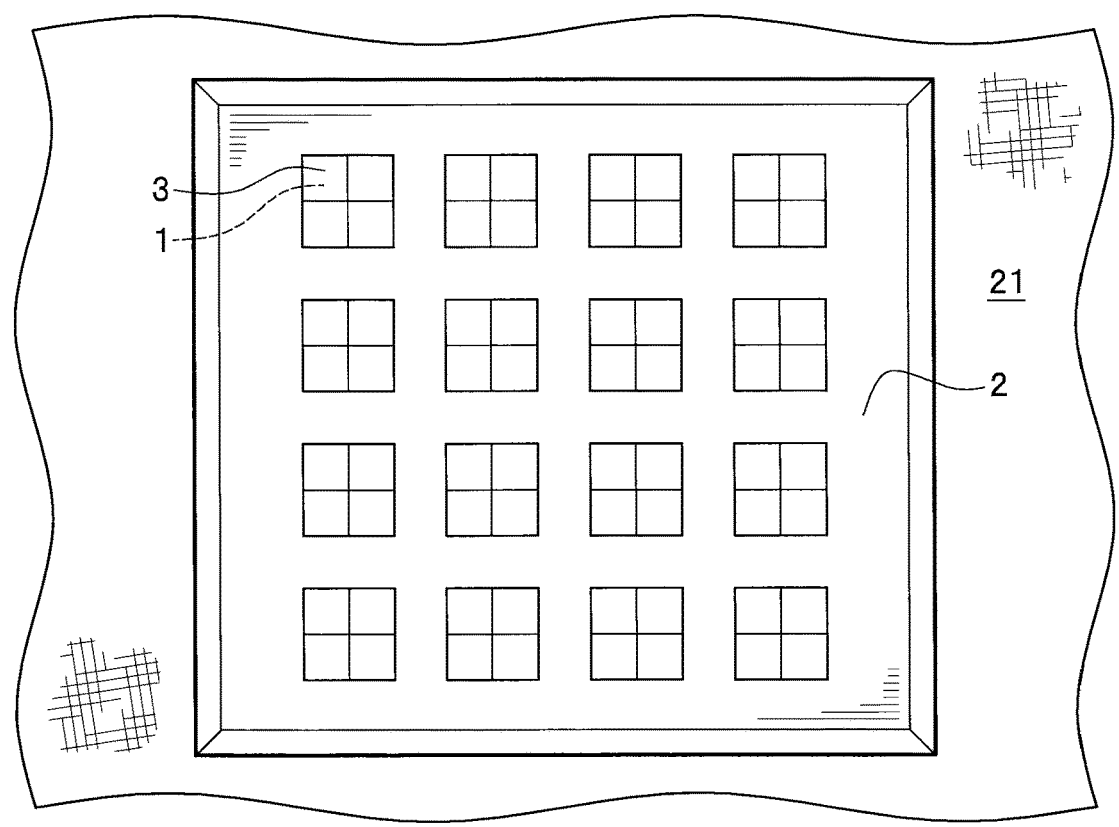
FIG. 17B is a plan view schematically showing covering the semiconductor elements by a covering member in a method of mounting semiconductor elements according to the seventh embodiment.
Figure 17C:
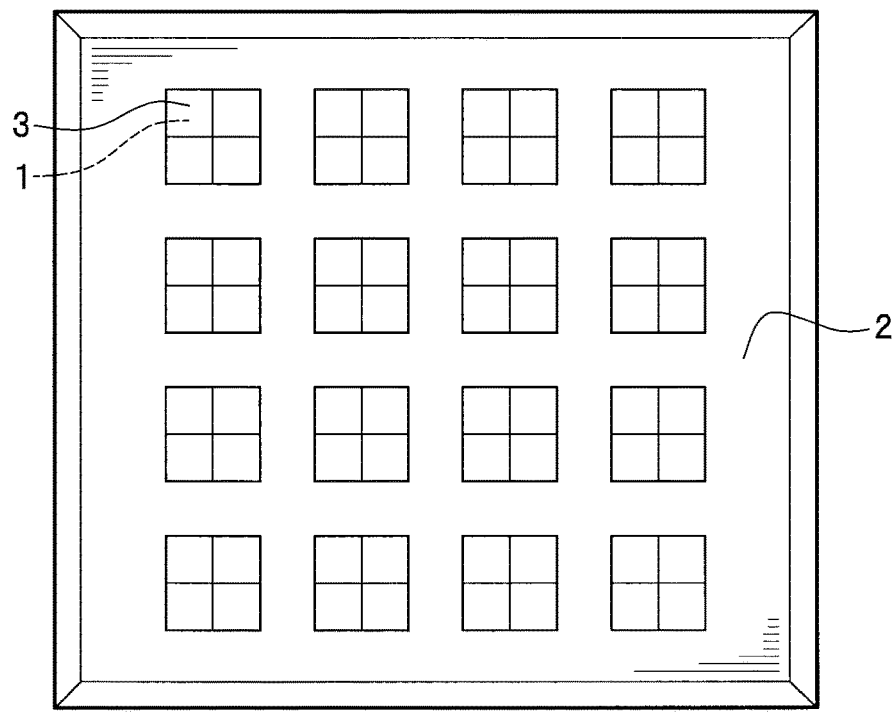
FIG. 17C is a plan view schematically illustrating removing support substrate in a method of mounting semiconductor elements according to the seventh embodiment.
Figure 17D:
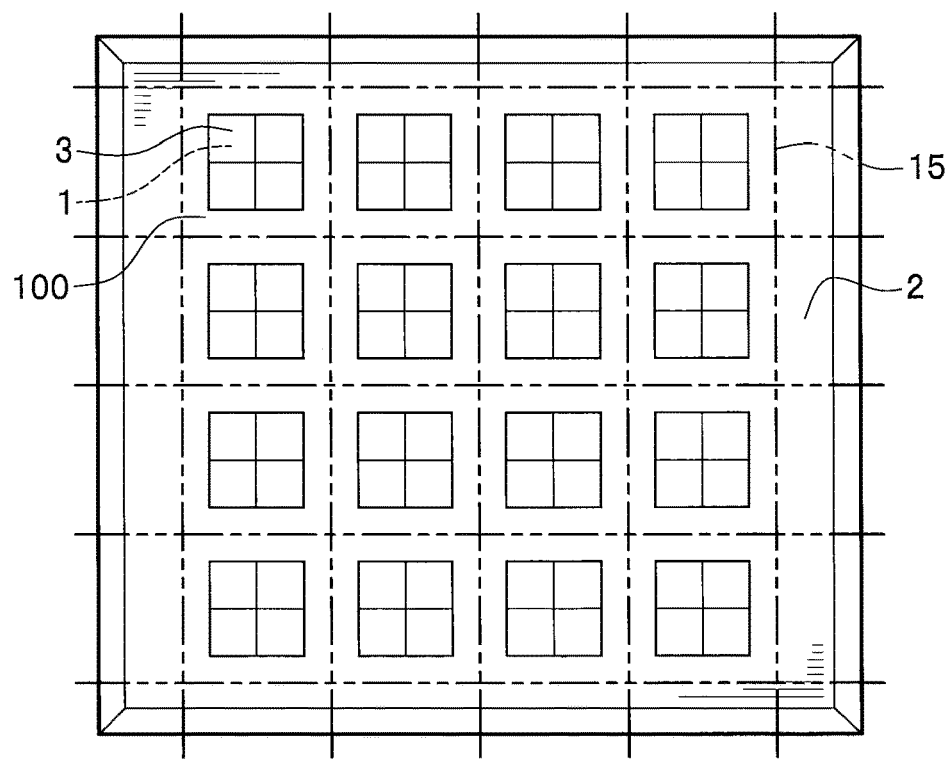
FIG. 17D is a plan view schematically illustrating separating predetermined groups of semiconductor elements into discrete groups in a method of mounting semiconductor elements according to the seventh embodiment.

FIG. 16 is a flow chart showing a procedure of a method of manufacturing a semiconductor device according to the seventh embodiment. FIG. 17A is a plan view schematically illustrating the disposing semiconductor elements on support substrate and the removing stretchable film, in the method of mounting semiconductor elements according to the seventh embodiment. FIG. 17B is a planar view schematically showing the covering semiconductor elements by covering member in a method of mounting semiconductor elements according to the seventh embodiment. FIG. 17C is a plan view schematically illustrating the removing support substrate, in the method of mounting semiconductor elements according to the seventh embodiment. FIG. 17D is a plan view schematically illustrating the separating predetermined groups of semiconductor elements into discrete groups, in the method of mounting semiconductor elements according to the seventh embodiment.

A method of manufacturing a semiconductor device can include performing the method of mounting semiconductor elements according to the seventh embodiment, disposing semiconductor elements on support substrate (S401) in which the semiconductor elements 1 are disposed on the support substrate 21 such that the electrodes 11 and 12 are opposite to the support substrate 21, removing stretchable film (S402), covering semiconductor elements by covering member (S403) in which the semiconductor elements 1 are covered by the covering member 2, removing support substrate (S404), and separating groups of semiconductor elements into discrete groups (S405) in which predetermined groups of the semiconductor elements 1 are separated into discrete groups each including a predetermined number of one or more semiconductor elements 1.

In the method of manufacturing a semiconductor device according to the seventh embodiment, in the disposing semiconductors on the support substrate (S401), the semiconductor elements 1 are mounted on the support substrate 21 with the respective electrodes 11 and 12 facing downward. That is, the semiconductor elements 1 are disposed on the support substrate 21 with the wavelength converting member 3 of the each of the semiconductor elements 1 facing upward. Next, in the removing stretchable film (S402), the stretchable film 20 is removed to expose the wavelength converting member 3 of each of the semiconductor elements 1. In the covering by covering member (S403), the covering member 2 is disposed on the support substrate 21 to cover lateral surfaces of the semiconductor elements 1. When an upper surface of the wavelength converting member 3 of each of the semiconductor elements 1 is covered by the covering member 2, the wavelength converting member 3 can be exposed by removing a portion of the covering member 2 by polishing or the like. Next, in the removing support substrate (S404), the molded product with exposed wavelength converting members 3 is removed from the support substrate 21.

Next, in the separating predetermined groups of semiconductor elements into discrete groups (S406), the molded product is separated along separation lines 15 at the respective predetermined regions, into discrete semiconductor devices 100. Other parts in the method are similar to those in the method of manufacturing semiconductor device according to the first embodiment.

Accordingly, semiconductor devices 100 each including four semiconductor elements 1 can be obtained.

Eighth Embodiment

Next, an example of a method of manufacturing a semiconductor device according to an eighth embodiment will be described. A method of mounting semiconductor elements according to the eighth embodiment is similar to the method of mounting the semiconductor elements according to the seventh embodiment and therefore the description thereof will be appropriately omitted.

Figure 18:
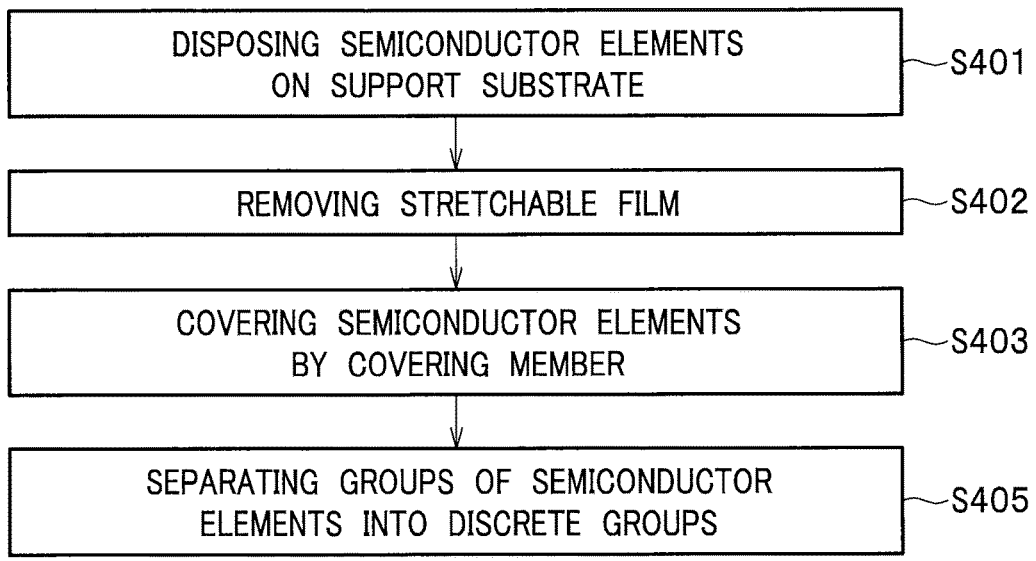
FIG. 18 is a flow chart showing a procedure of a method of manufacturing a semiconductor device according to an eighth embodiment.
Figure 19:
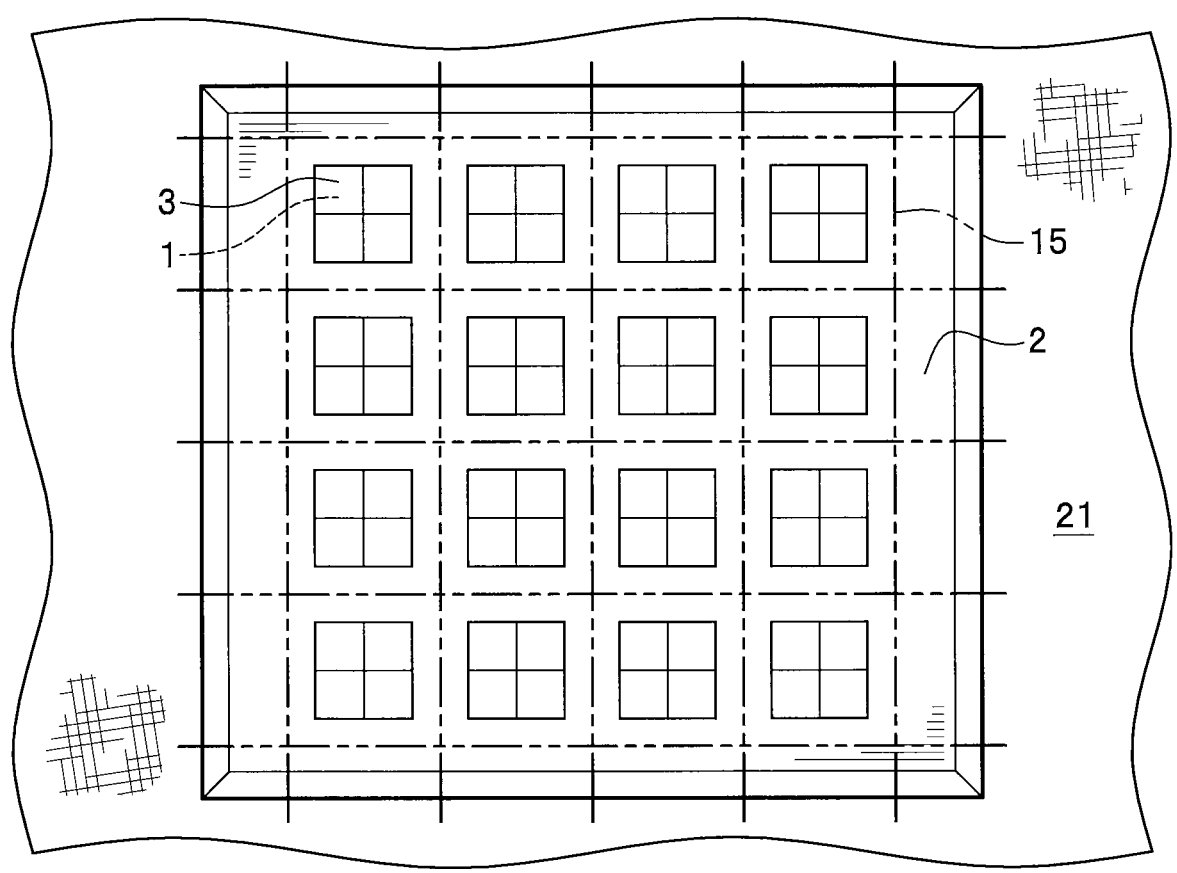
FIG. 19 is a plan view schematically illustrating separating predetermined groups of semiconductor elements into discrete groups in a method of mounting semiconductor elements according to the eighth embodiment.

FIG. 18 is a flow chart showing a procedure of a method of manufacturing a semiconductor device according to the eighth embodiment. FIG. 19 is a plan view schematically illustrating separating predetermined groups of semiconductor elements into discrete groups in a method of mounting semiconductor elements according to the eighth embodiment.

The method of manufacturing a semiconductor device according to the eighth embodiment can include disposing semiconductor elements on support substrate (S401) in which the plurality of semiconductor elements 1 are disposed on a support substrate 21 such that the electrodes 11 and 12 of respective semiconductor elements 1 are opposite to the support substrate 21; removing stretchable film (S402), covering semiconductor elements by covering member (S403) in which the plurality of semiconductor elements 1 are covered by the covering member 2; and separating predetermined groups of semiconductor elements into discrete groups (S405) in which predetermined groups of the semiconductor elements 1 are separated into discrete groups each including a predetermined number of one or more semiconductor elements 1.

In the method of manufacturing a semiconductor device according to the eighth embodiment, the removing support substrate (S404) is not performed, and the predetermined groups of the semiconductor elements 1 are separated on the support substrate 21 into discrete groups. In the separating predetermined groups of the semiconductor elements into discrete groups (S405), the support substrate 21 may be separated or may not be separated. The support substrate 21 may be removed after the separating predetermined groups of the semiconductor elements 1 into discrete groups (S405).

Ninth Embodiment

Next, an example of a method of manufacturing a semiconductor device according to a ninth embodiment will be described. The method of mounting semiconductor elements according to the ninth embodiment is similar to the method of mounting the semiconductor elements according to the seventh embodiment and therefore the description thereof will be appropriately omitted.

Figure 20A:
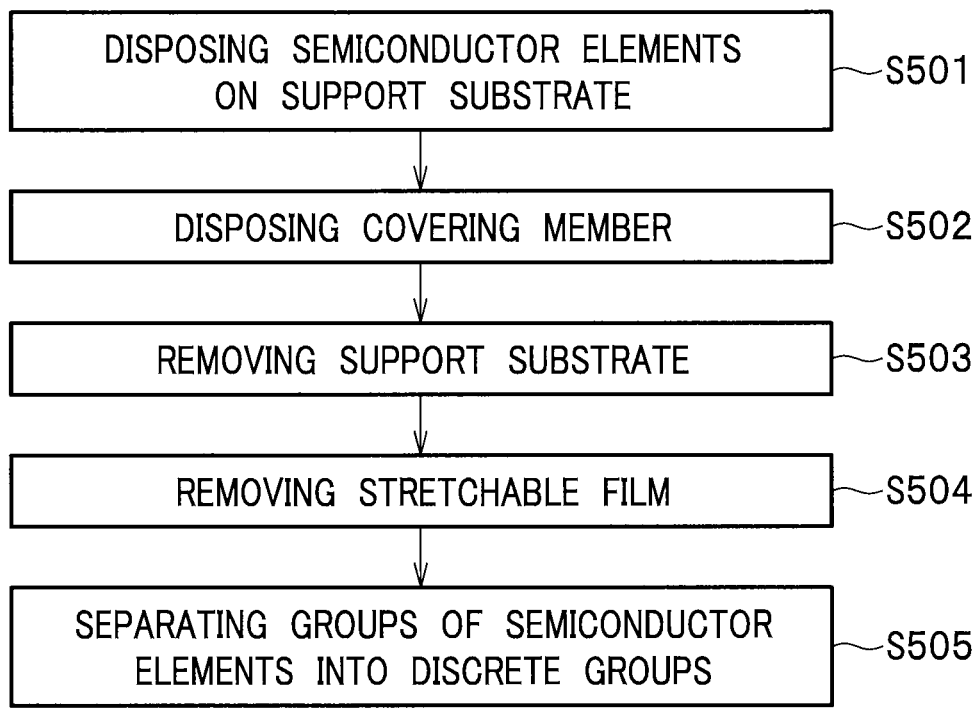
FIG. 20A is a flow chart showing a procedure of a method of manufacturing a semiconductor device according to a second embodiment.

FIG. 20A is a flow chart showing a procedure of a method of manufacturing a semiconductor device according to the ninth embodiment.

The method of manufacturing a semiconductor device can include performing the method of mounting semiconductor elements according to the seventh embodiment; disposing semiconductor elements on support substrate (S501) in which the semiconductor elements 1 are disposed with the electrodes 11 and 12 opposite to the support substrate 21; disposing covering member (S502) in which a covering member 2 is disposed between the support substrate 21 and the stretchable film 20, removing support substrate (S503), removing stretchable film (S504), and separating predetermined groups of semiconductor elements into discrete groups (S505) in which predetermined groups of the semiconductor elements 1 are separated into discrete groups each including a predetermined number of one or more semiconductor elements 1.

In disposing covering member (S502), the covering member 2 is disposed between the outer the stretched stretchable film 20 to cover lateral surfaces of the semiconductor elements 1. Covering the semiconductor elements 1 can be performed similarly to the method of manufacturing a semiconductor device according to the first embodiment, except that the covering member 2 is filled between the support substrate 21 and the stretchable film 20. Other operations can be performed in a similar manner as in the method of manufacturing a semiconductor device according to the seventh embodiment, except that certain operations may be performed in a different order.

Accordingly, semiconductor devices 100 each including four semiconductor elements 1 can be obtained.

Tenth Embodiment

Next, a light semiconductor device according to a tenth embodiment will be described. The method of mounting semiconductor elements according to the tenth embodiment is similar to the method of mounting the semiconductor elements according to the seventh embodiment and therefore the description thereof will be appropriately omitted.

Figure 20B:
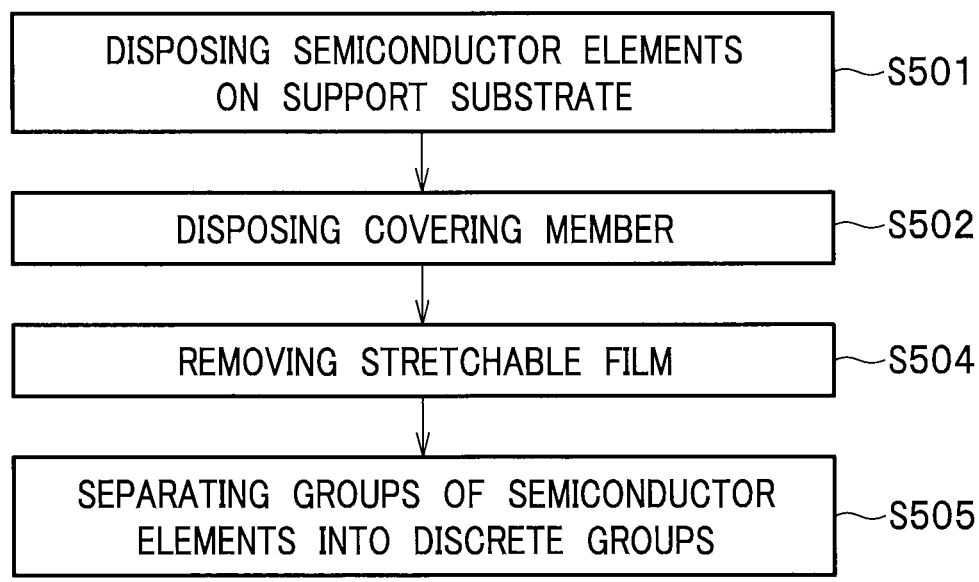
FIG. 20B is a flow chart showing a procedure of a method of manufacturing a semiconductor device according to a tenth embodiment.

FIG. 20B is a flow chart showing a procedure of a method of manufacturing a semiconductor device according to a tenth embodiment.

The method of manufacturing a semiconductor device according to the tenth embodiment can include disposing the semiconductor elements on support substrate (S501) in which the semiconductor elements 1 are disposed on the support substrate 21 with the respective electrodes 11 and 12 opposite to the support substrate 21; disposing covering member (S502) in which a covering member is disposed between the support substrate 21 and the stretchable film 20 to cover lateral surfaces of each of the plurality of semiconductor elements 1, removing stretchable film (S504), and separating predetermined groups of semiconductor elements into discrete groups (S505).

In the method of manufacturing a semiconductor device according to the tenth embodiment, the removing support substrate (S503) is not performed, and predetermined group of the semiconductor elements 1 are separated into discrete groups on the support substrate 21. In the separating predetermined groups of the semiconductor elements (S505), the support substrate 21 may be separated or may not be separated. The support substrate 21 may be removed after the separating (S505) the semiconductor elements 1 into predetermined groups.

Eleventh Embodiment

Semiconductor Device

A semiconductor device according to an eleventh embodiment will be described below.

Figure 21A:
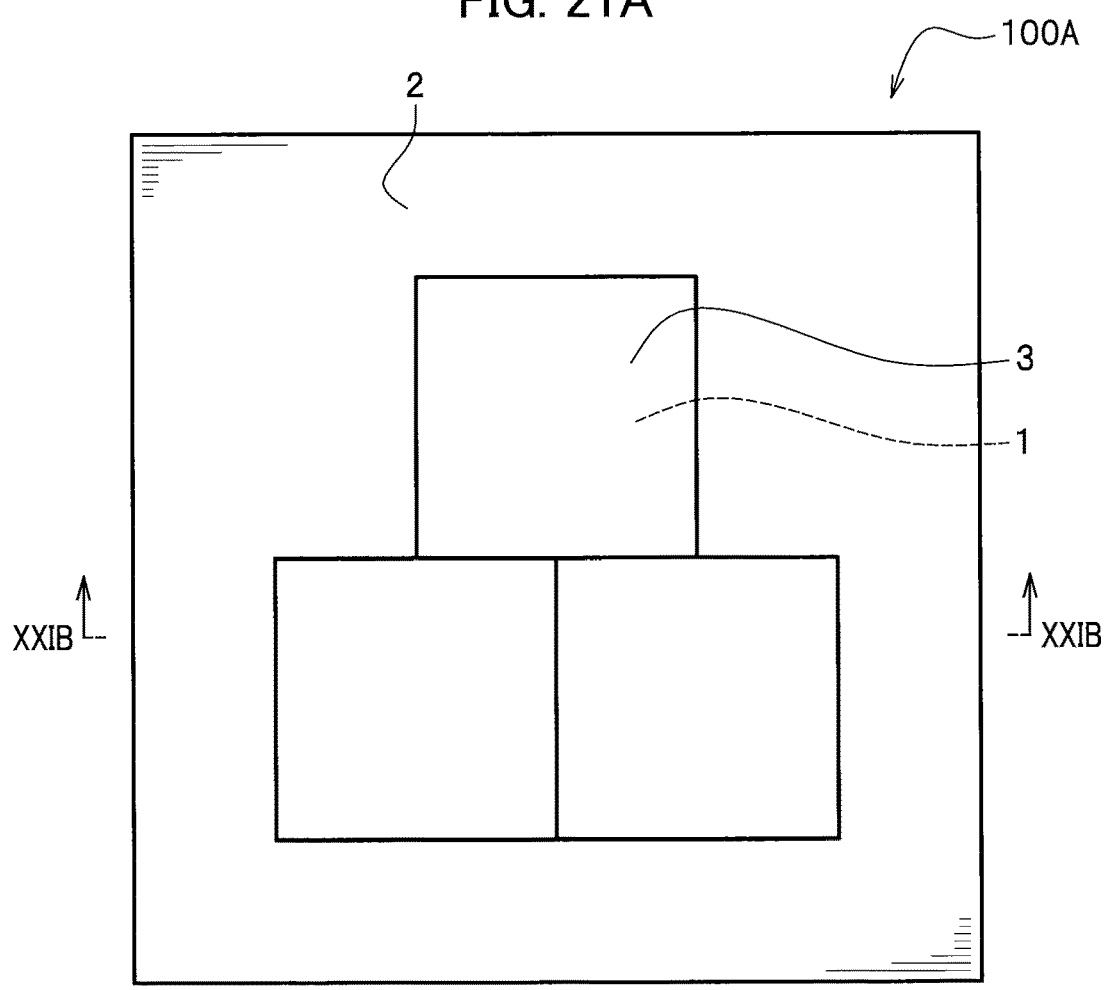
FIG. 21A is a plan view schematically showing a configuration of a semiconductor device according to an eleventh embodiment.
Figure 21B:
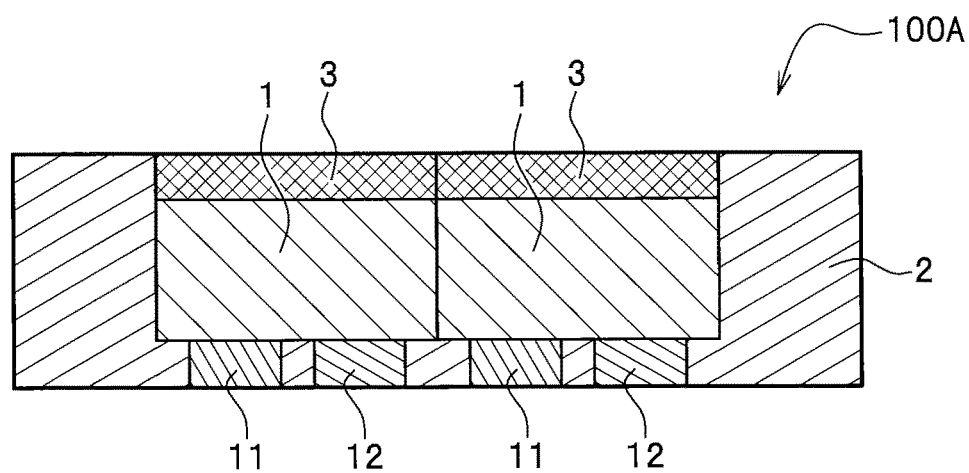
FIG. 21B is a cross-sectional view, taken along line XXIB-XXIB of FIG. 21A, schematically showing a configuration of a light emitting device according to the eleventh embodiment.

FIG. 21A is a plan view schematically showing a configuration of a semiconductor device according to an eleventh embodiment. FIG. 21B is a cross-sectional view, taken along line XXIB-XXIB of FIG. 21A, schematically showing a configuration of a light emitting device according to the eleventh embodiment.

The semiconductor device 100A includes semiconductor elements 1, a covering member 2, and wavelength converting members 3.

In the semiconductor device 100A, three semiconductor elements 1 are disposed such that straight imaginary line segments connecting canters of the three semiconductor elements in a matrix of 2 rows×3 columns. That is, in the semiconductor device 100 including three semiconductor elements 1, two semiconductor elements 1 are disposed adjacent to each other and one semiconductor device 1 is disposed adjacent to both the two semiconductor elements 1.

The three semiconductor elements 1 are a first semiconductor element to emit red light, a second semiconductor element to emit blue light, and a third semiconductor element to emit green light.

With the use of the semiconductor device 100A having a configuration described above, a full-color display becomes possible.

For the semiconductor element 1 for emitting light of a blue color (emission wavelength of 430 to 490 nm) or a green color (emission wavelength of 495 to 565 nm), a nitride-based semiconductor ($In_XAl_YGa_{1-X-Y}N$, 0≤X, 0≤Y, X+Y≤1), GaP etc., can be used. For the semiconductor element 1 for emitting light of a red color (emission wavelength of 610 to 700 nm), GaAlAs, AlInGaP or the like can a nitride-based semiconductor ($In_XAl_YGa_{1-X-Y}N$, 0≤X, 0≤Y, X+Y≤1), can be used beside a nitride-based semiconductor.

Other parts in the method are similar to those in the method of manufacturing semiconductor device 100 according to the first embodiment.

Method of Mounting Semiconductor Element

Next, an example of a method of mounting semiconductor elements will be described.

Figure 22A:
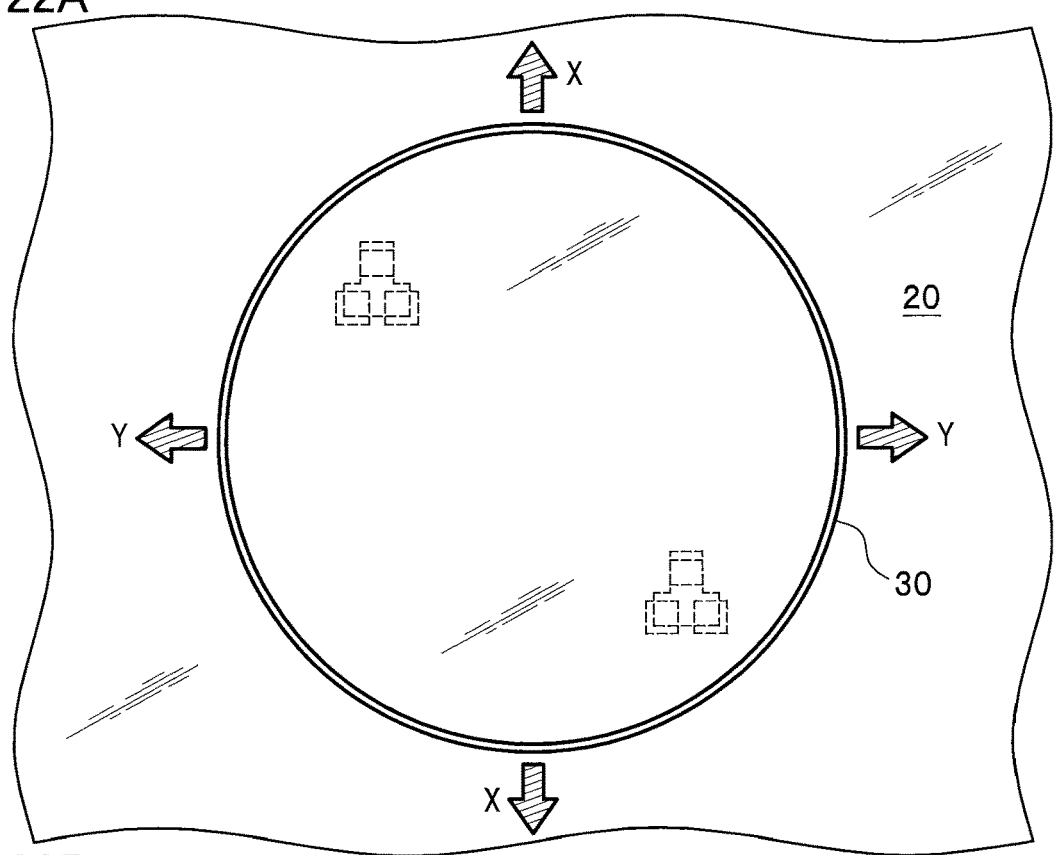
FIG. 22A is a plan view schematically showing a stretched state of a stretchable film that is attached to a fixture and stretched by using the fixture, in the disposing semiconductor elements in a method of mounting semiconductor elements according to the eleventh embodiment.
Figure 22B:
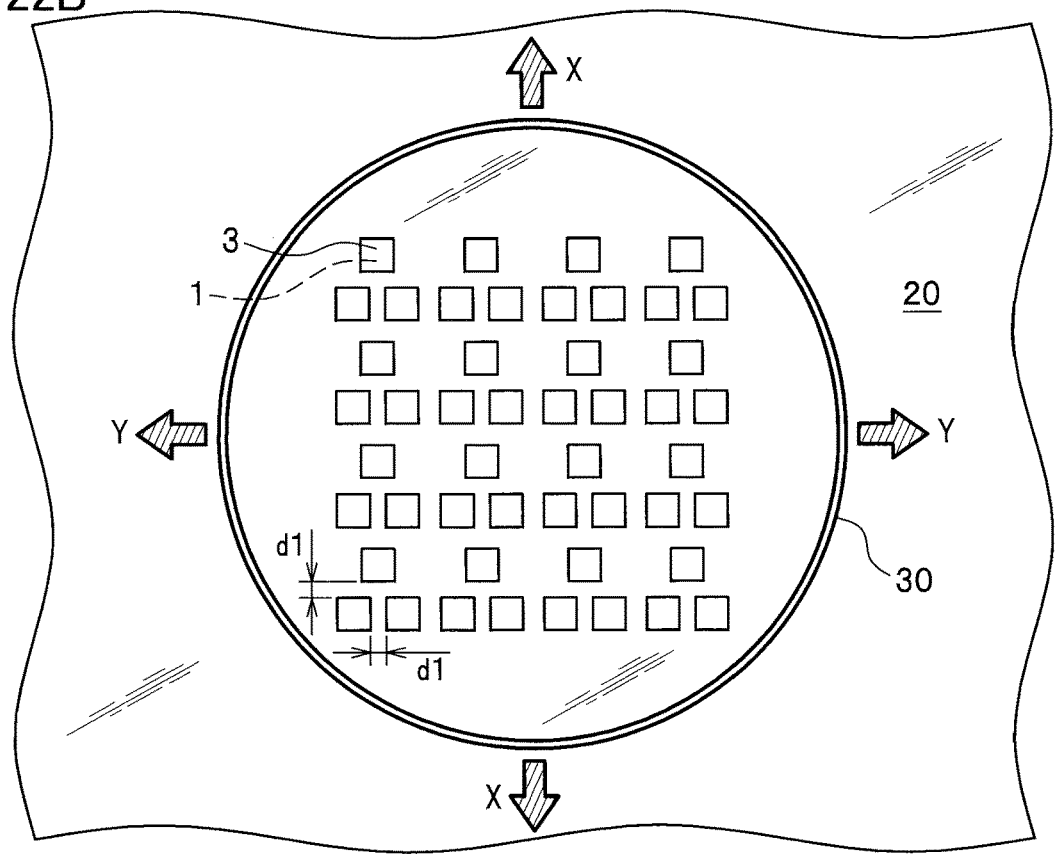
FIG. 22B is a plan view schematically showing a state in which semiconductor elements are disposed on a stretchable film in the disposing semiconductor elements in a method of mounting semiconductor elements according to the eleventh embodiment.
Figure 22C:
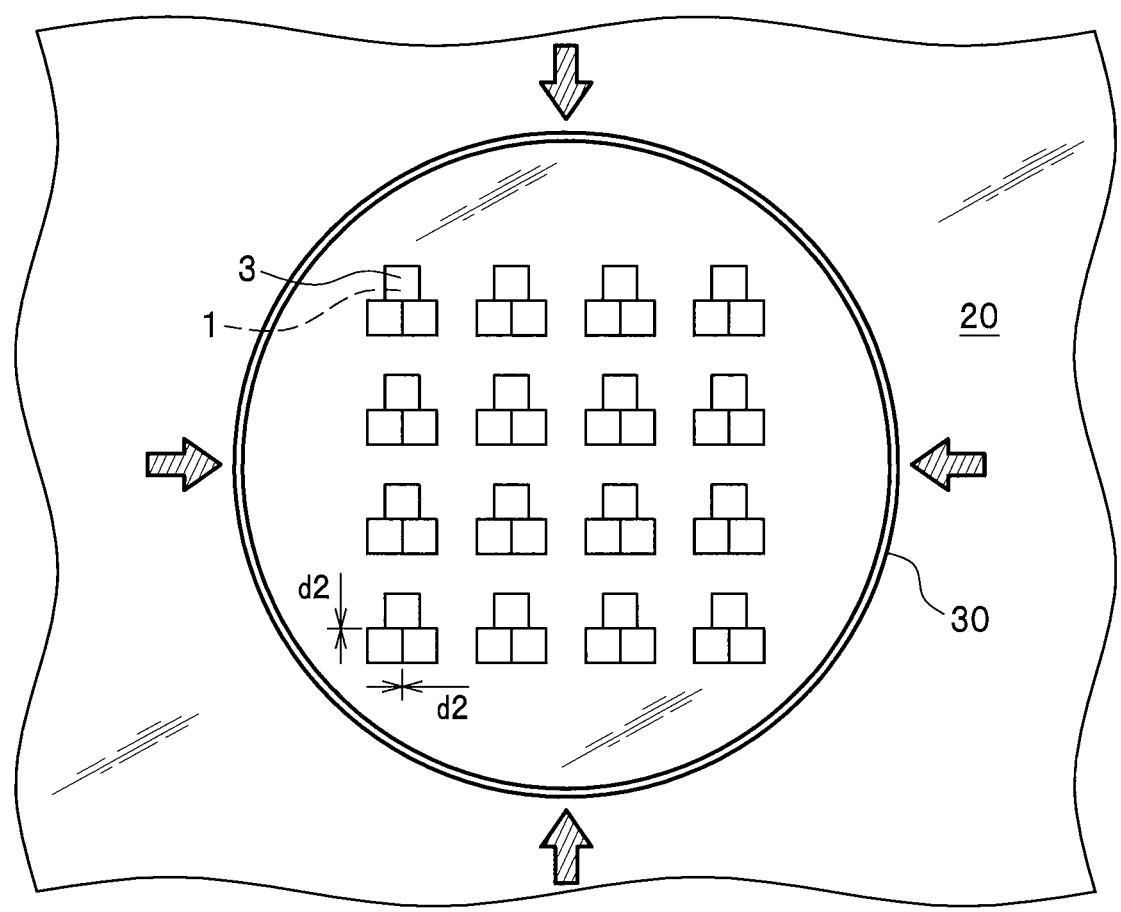
FIG. 22C is a plan view schematically illustrating releasing stretchable film from stretched state in a method of mounting semiconductor elements according to the eleventh embodiment.

FIG. 22A is a plan view schematically showing a stretched state of a stretchable film that is attached to a fixture and stretched by using the fixture, in the disposing semiconductor elements in a method of mounting semiconductor elements according to the eleventh embodiment. FIG. 22B is a plan view schematically showing a state in which semiconductor elements are disposed on a stretchable film in the disposing semiconductor elements in a method of mounting semiconductor elements according to the eleventh embodiment. FIG. 22C is a plan view schematically illustrating the releasing stretchable film from stretched state in a method of mounting semiconductor elements according to the eleventh embodiment.

The method of mounting semiconductor elements according to the eleventh embodiment is similar to the method of mounting the semiconductor elements according to the first embodiment, including disposing semiconductor elements (S101) and releasing stretchable film from stretched state (S102), which are performed in this order. The materials, arrangement, or the like of respective members are those described above in the semiconductor device 100A and therefore the description thereof may be appropriately omitted.

The method of mounting semiconductor elements includes disposing semiconductor elements (S101) in which the four directions of stretching the stretchable film 20 are adjusted such that after releasing the stretched state of the stretchable film 20, the three semiconductor elements 1 are located at predetermined positions. In the method of disposing semiconductor elements, in the disposing semiconductor elements (S101), a single group of three semiconductors 1 are disposed such that virtual straight line segments connecting centers of the three semiconductor elements 1 form a triangular shape. Also, in the method of mounting semiconductor elements, in releasing stretched film from stretched state (S102), distances among three semiconductor elements 1 in each single group are reduced to a predetermined mounting distance of the semiconductor elements 1. Others are similar to the method of mounting semiconductor elements according to the first embodiment.

Method of Manufacturing Semiconductor Device

The method of manufacturing semiconductor device according to an eleventh embodiment can be performed similarly to the method of manufacturing a semiconductor device according to the method of manufacturing a semiconductor device according to one or more of the first to the tenth embodiments, except that a single group of semiconductor elements 1 includes three semiconductor elements 1.

Accordingly, semiconductor devices 100A each including three semiconductor elements 1 can be obtained.

Twelfth Embodiment

Semiconductor Device

A semiconductor device according to a twelfth embodiment will be described below.

Figure 23A:
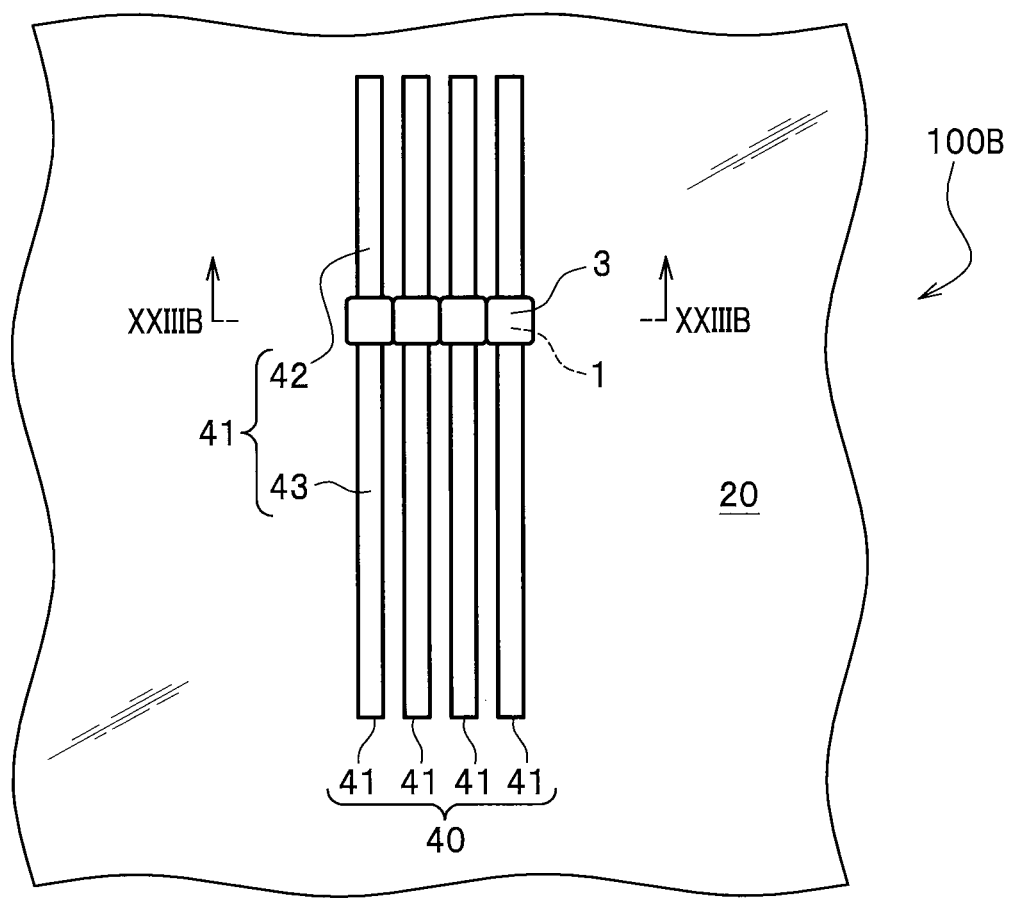
FIG. 23A is a plan view schematically showing a configuration of a semiconductor device according to a twelfth embodiment.
Figure 23B:
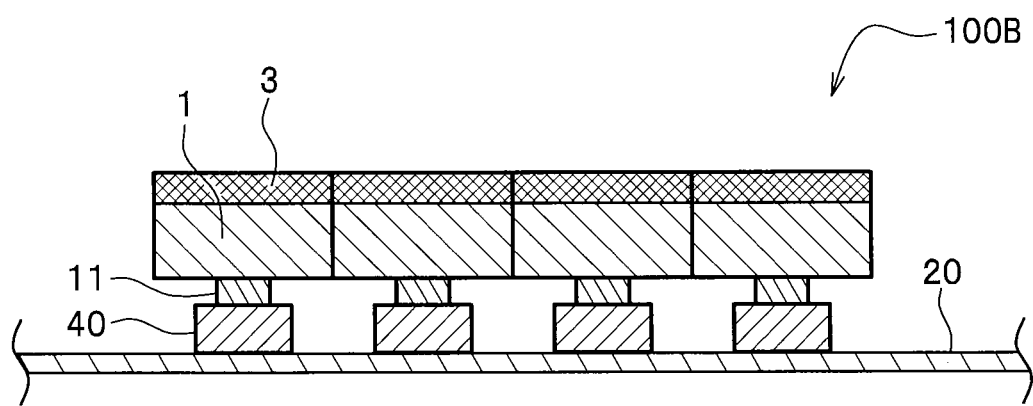
FIG. 23B is a cross-sectional view, taken along line XXIIIB-XXIIIB of FIG. 23A, schematically showing a configuration of a light emitting device according to the twelfth embodiment.

FIG. 23A is a plan view schematically showing a configuration of a semiconductor device according to the twelfth embodiment. FIG. 23B is a cross-sectional view, taken along line XXIIIB-XXIIIB of FIG. 23A, schematically showing a configuration of a light emitting device according to the twelfth embodiment.

The semiconductor device 100B includes a stretchable film 20, a group of wiring patterns 40, a plurality of semiconductor elements 1, and a plurality of wavelength converting members 3.

For the stretchable film 20, a stretchable film 20 similar to the stretchable film 20 described in the method of mounting the semiconductor elements according to the first embodiment can be used. For the plurality of semiconductor elements 1 and a plurality of wavelength converting members 3, semiconductor elements 1 and wavelength converting members 3 similar to those described in the first embodiment 100 can be used.

Each two adjacent semiconductor elements 1 are spaced apart from each other with the second distance in a range of 0 to 50 μm. When the second distance is 0 μm or greater, manufacturing of the semiconductor device 100B can be facilitated. Meanwhile, the second distance of 50 μm or less allows for a higher density mounting of the semiconductor elements 1, which allows for a reduction in the dimensions of the semiconductor device 100B.

Wiring Pattern

The group of wiring patterns 40 includes a plurality of pairs of wiring patterns 41 each having a first wiring part 42 and a second wiring part 43 and a region for disposing corresponding one of the semiconductor elements 1, in which the plurality of pairs of wiring patterns 41 are disposed at uniform intervals such that regions for disposing corresponding semiconductor elements 1 are aligned in a transverse direction in a plan view.

Figure 25A:
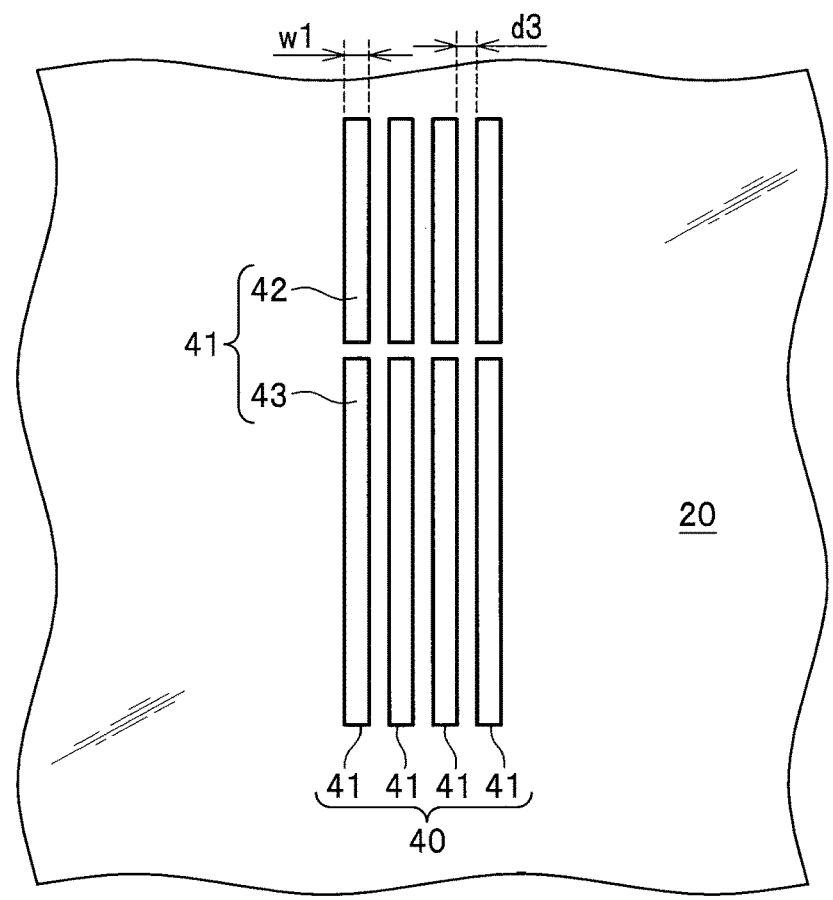
FIG. 25A is a plan view schematically illustrating disposing wiring patterns in a method of mounting semiconductor elements according to the eleventh embodiment.

Each of the plurality of pairs of wiring patterns 41 are disposed on the stretchable film 20 such that two straight-line shaped wirings: a first wiring part 42 and a second wiring part 43, are disposed spaced apart from each other at a predetermined distance with respective ends facing aligned with each other, as shown in FIG. 25A. The group of wiring patterns 40 includes four pairs of wiring patterns 41 disposed in parallel to one other. Each of the pair of wiring patterns 41 as shown in FIG. 23A are connected to a single semiconductor element 1 such that the first wiring part 42 is connected to the first electrode 11 of the semiconductor element 1 and the second wiring part 43 is connected to the second electrode 12 of the semiconductor element 1, which are shown in FIG. 1B. Accordingly, each of the semiconductor elements 1 is disposed straddling on a corresponding pair of the wiring patterns 41 such that the plurality of semiconductor elements 1 are aligned in a transverse direction in a plan view.

Examples of the materials of the group of wiring pattern 40 include metal materials such as copper, electrically conductive paste, and stretchable paste.

Method of Mounting Semiconductor Elements and Method of Manufacturing Semiconductor Device Next, a method of mounting semiconductor elements and a method of manufacturing semiconductor elements will be described.

Figure 24:
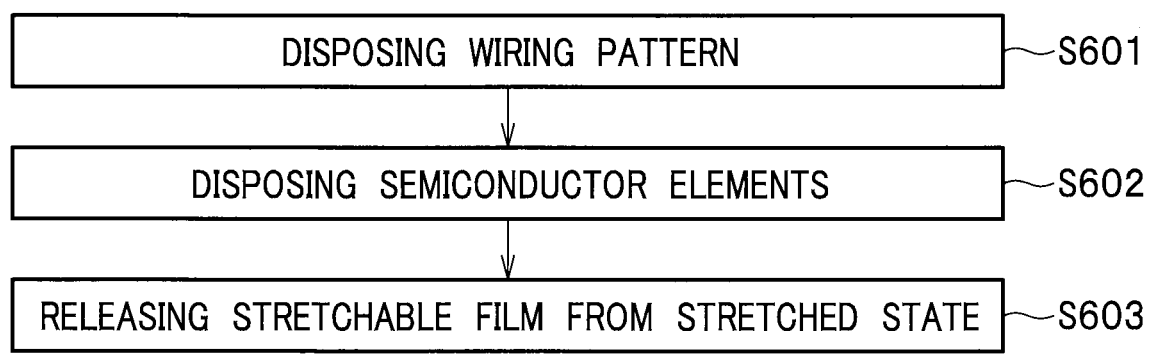
FIG. 24 is a flow chart showing a procedure of a method of mounting semiconductor elements according to a twelfth embodiment.

FIG. 24 is a flow chart showing a procedure of a method of mounting semiconductor elements according to a twelfth embodiment.

Figure 25B:
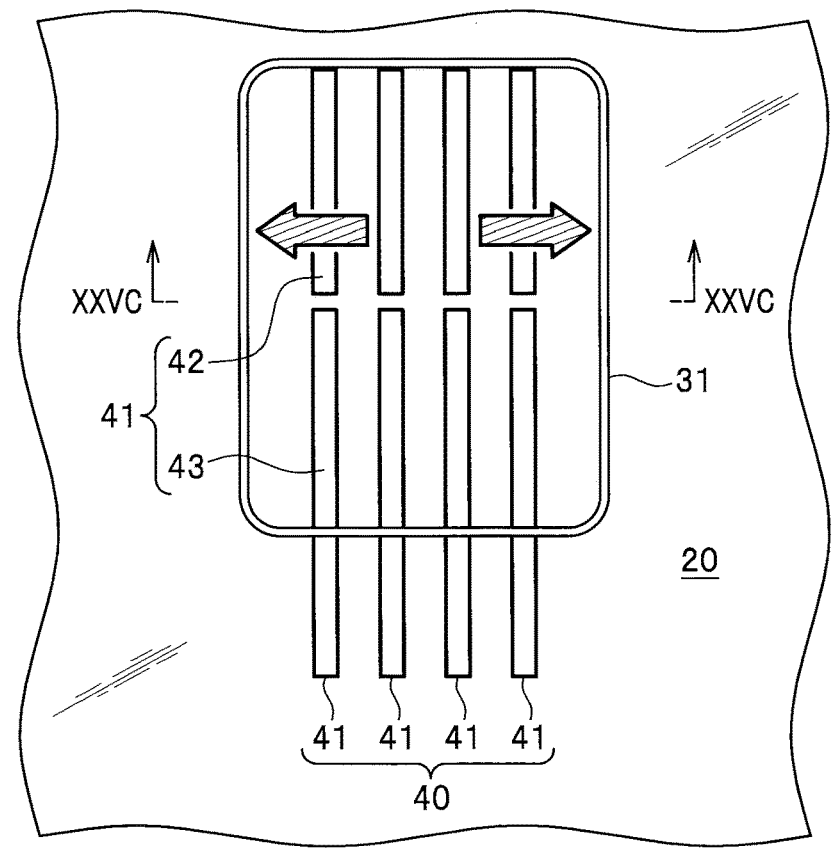
FIG. 25B is a plan view schematically showing a stretched state of a stretchable film that is attached to a fixture and stretched by using the fixture, in the disposing semiconductor elements in a method of mounting semiconductor elements according to the twelfth embodiment.
Figure 25C:
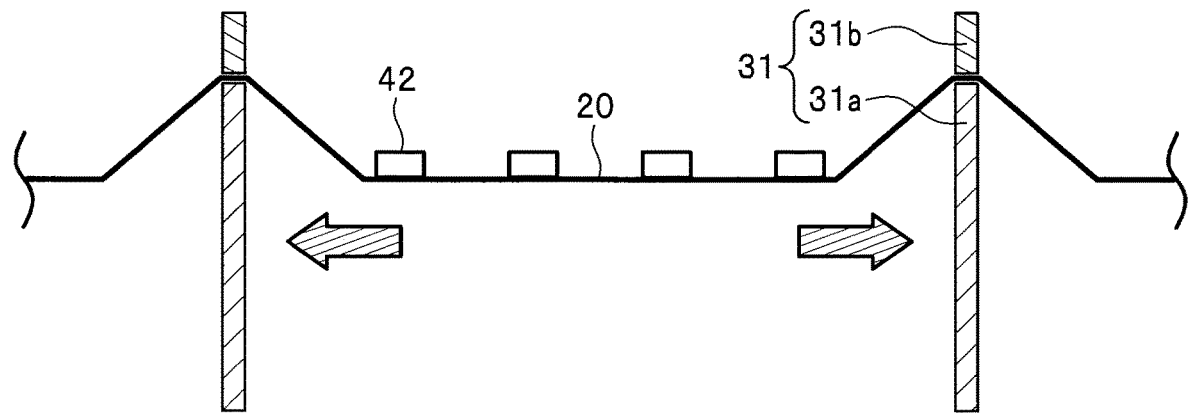
FIG. 25C is a schematic cross-sectional view taken along line XXVC-XXVC of FIG. 25B.
Figure 25D:
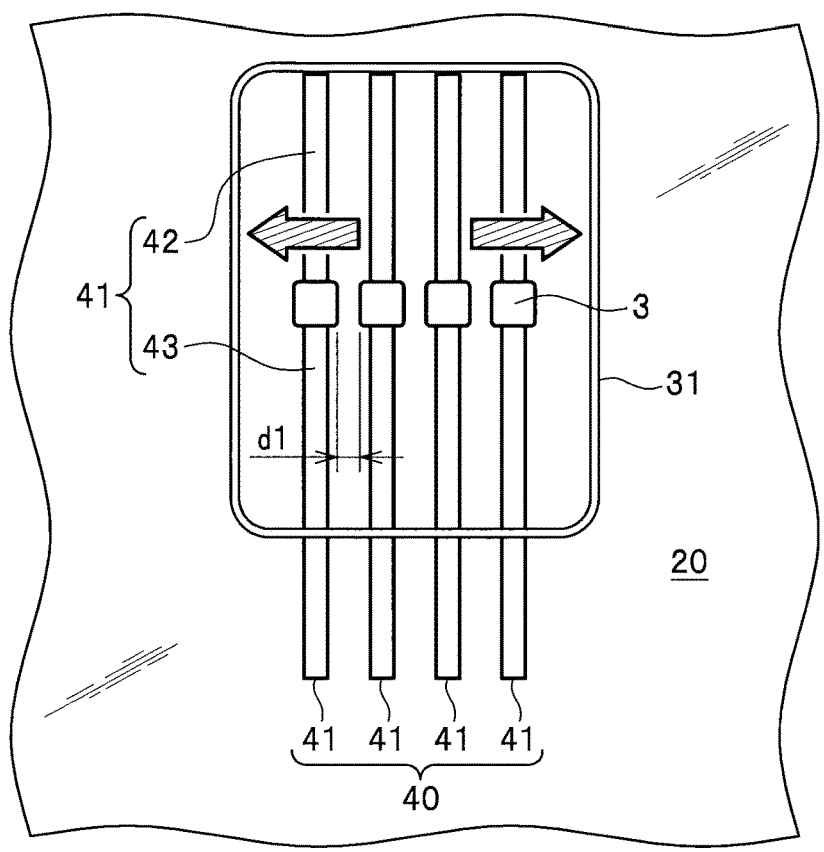
FIG. 25D is a plan view schematically showing a state in which semiconductor elements are disposed on a stretchable film in the disposing semiconductor elements in a method of mounting semiconductor elements according to the twelfth embodiment.
Figure 25E:
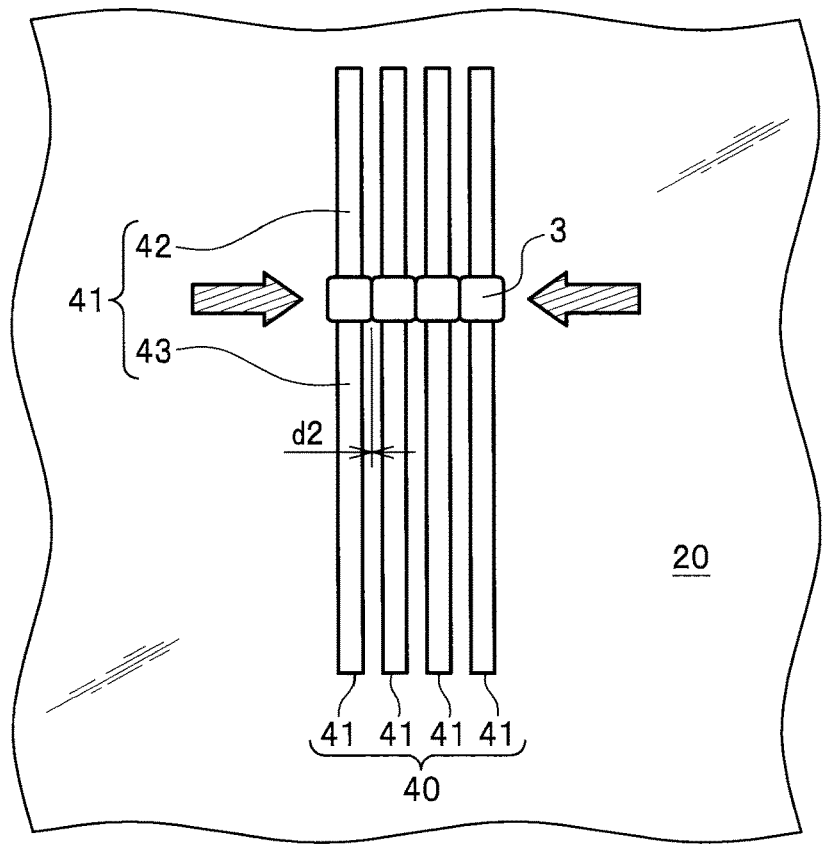
FIG. 25E is a plan view schematically illustrating releasing stretchable film from stretched state in a method of mounting semiconductor elements according to the twelfth embodiment.

FIG. 25A is a plan view schematically illustrating disposing a wiring pattern in a method of mounting semiconductor elements according to the eleventh embodiment. FIG. 25B is a plan view schematically showing a stretched state of a stretchable film that is attached to a fixture and stretched by using the fixture, in the disposing semiconductor elements in a method of mounting semiconductor elements according to the twelfth embodiment. FIG. 25C is a schematic cross-sectional view taken along line XXVC-XXVC of FIG. 25B. FIG. 25D is a plan view schematically showing a state in which semiconductor elements are disposed on a stretchable film in the disposing semiconductor elements in a method of mounting semiconductor elements according to the twelfth embodiment. FIG. 25E is a plan view schematically illustrating releasing stretchable film from stretched state in a method of mounting semiconductor elements according to the twelfth embodiment.

In the twelfth embodiment, the stretchable film having the semiconductor elements mounted thereon by using the method of mounting semiconductor elements is processed to a semiconductor device, and therefore, the method of mounting semiconductor elements and the method of manufacturing a semiconductor device take the same process. Therefore, a method of mounting semiconductor elements will be described below.

A method of mounting semiconductor elements can include disposing wiring pattern (S601) in which a group of wiring patterns 40 is disposed on a stretchable film, disposing a plurality of semiconductor elements (S602) in which the stretchable film is stretched against an elastic force into a stretched state and a plurality of semiconductor elements are disposed in predetermined regions on the stretchable film in the stretched state, each of the predetermined regions to have a predetermined group of semiconductor elements 1 spaced apart from one other, and releasing the stretchable film from the stretched state (S603) in which the stretchable film 20 is released from the stretched state by using the elastic force of the stretchable film 20. In the disposing wiring pattern (S601), a plurality of pairs of wiring patterns 41 each having a first wiring part and a second wiring part and a region for disposing a corresponding one of the plurality of semiconductor elements 1 are disposed at uniform intervals such that regions for mounting corresponding semiconductor elements 1 are aligned in a transverse direction in a plan view.

In the method of mounting semiconductor elements, a second distance (d2) between adjacent semiconductor elements after releasing the stretchable film from its stretched state is smaller than a first distance (d1) between adjacent semiconductor elements disposed on the stretchable film in the stretched state to a mounting distance between adjacent semiconductor elements.

Each of these operations will be described below. The details of each member of the Each component member are as described above semiconductor and therefore the description thereof may be appropriately omitted.

Disposing Wiring Patterns

As shown in FIG. 25A, in disposing wiring patterns (S601), a group of wiring patterns 40 is disposed on a stretchable film 20.

In the disposing wiring patterns (S601), a plurality of pair of wiring patterns 41 each having a first wiring part 42 and a second wiring part 43 and a region for mounting a corresponding one of the plurality of semiconductor elements 1 are disposed at uniform intervals such that regions for mounting the semiconductor elements 1 are aligned in a transverse direction in a plan view.

Each of the plurality of pairs of wiring patterns 41 are disposed on the stretchable film 20 such that two straight-line shaped wirings of first wiring part 42 and second wiring part 43 are disposed spaced apart from each other at a predetermined distance with respective ends facing aligned with each other.

The group of wiring patterns 40 can be disposed, for example, by bonding a copper foil on the surface of the stretchable film 20 and applying etching. Alternatively, the group of wiring patterns 40 can also be disposed by applying an electrically conductive paste or a stretchable paste on the surface of the stretchable film 20.

The width (w1) of each of the plurality of pairs of wiring patterns 41 is preferably in a range of 20 to 500 µm. When the width (w1) of each of the plurality of pairs of wiring patterns 41 is 20 µm or greater, mounting of the semiconductor elements 1 on the wiring patterns 41 can be facilitated. Meanwhile, when the width (w1) of each of the plurality of pairs of wiring patterns 41 is 500 µm or less, adjusting of the mounting distance between the semiconductor elements 1 after releasing the stretched state can be facilitated. The width (w1) of each of the plurality of pairs of wiring patterns 41 is more preferably within a range of 50 to 200 µm.

The distance (d3) between two adjacent pairs of wiring patterns 41 (hereinafter may be referred to as "pattern width") is preferably in a range of 20 to 500 When the pattern width is in the range described above, adjusting of the mounting distances between semiconductor elements 1 after releasing the stretched state can be facilitated. The pattern width is preferably in a range of 50 to 200 µm.

Disposing Semiconductor Elements

In the disposing semiconductor elements (S602), a stretchable film is stretched against an elastic force into a stretched state and a plurality of semiconductor elements 1 are disposed spaced apart from one other at a first distance (d1) on a predetermined region of the stretchable film in the stretched state.

In the disposing semiconductor elements (S602), a fixture 31 is attached to a predetermined region of the stretchable film 20, and the stretchable film 20 is stretched against elastic force by using the fixture 31, and the stretchable film 20 in its stretched state is secured to the fixture 31.

More specifically, the stretchable film 20 is stretched in two opposite directions to increase a distance (d3) between two adjacent pairs of wiring patterns 41 as shown in FIG. 25B, and with maintaining the stretched state, the stretchable film 20 is secured to the fixture 31.

Securing the stretchable film 20 in its stretched state to the fixture can be performed by pushing the stretchable film 20 up from its back-side by using a push-up member 31a, and from an upper side, securing the pushed-up portions of the stretchable film 20 by a securing member 31b of the fixture 31.

In the present embodiment, a right side and a left side of a single group of wiring patterns 40 are pushed up to stretch the stretchable film 20 in a right direction and a left direction.

The distance (d3) between adjacent pairs of wiring patterns 41 is adjusted such that the distance between the semiconductor elements 1 can be in a predetermined range in the disposing semiconductor elements (S602). Distance (d3) between two adjacent wiring patterns in a pair of wiring patterns 41 can be adjusted by amount of stretching of the stretchable film 20 which can be adjusted by a height of pushing-up using the push-up member 31a.

When the second distance d2 between each two adjacent semiconductor elements 1 in the semiconductor device 100B is configured to be in a range of 200 µm or less, the stretch width of the stretchable film 20 stretched in the opposite two directions is preferably in a range of 50 to 500 µm. When the stretched width is 50 µm or greater, disposing of the semiconductor elements 1 on the stretchable film 20 can be facilitated. Meanwhile, when the stretched width is 500 µm or less, distortion in the distribution of the semiconductor elements 1 in the mounting region can be reduced. The stretched width is more preferably in a range of 50 to 200 µm.

In the disposing semiconductor elements (S602), the semiconductor elements 1 are disposed adjacent to each other, each bridging a longitudinal pair of wiring patterns 41 each including first and second wirings 42 and 43, and the semiconductor elements 1 are disposed aligned in a transverse direction in a plan view. In the present embodiment, four semiconductor elements 1 are disposed aligned in a transverse direction in a plan view. In the disposing semiconductor elements (S602), for example, the semiconductor elements 1 are disposed such that adjacent semiconductor elements 1 are spaced apart from each other at a distance in a range of 50 to 500 µm.

Releasing Stretchable Film from Stretched State

In the releasing stretchable film from stretched state (S603), the stretched state of the stretchable film 20 is released by using elastic force of the stretchable film 20. In the releasing stretchable film from stretched state (S603), the stretchable film 20 is removed from the fixture 30 that has been maintaining the stretched state of the stretchable film 20, to release the stretched state of the stretchable film 20 by its elastic force. More specifically, releasing of the stretchable film 20 from its stretched state is performed by removing the securing member 31b of the fixture 31 and undoing the pushing-up of the push-up member 31a.

In the releasing stretchable film from stretched state (S603), the first distance (d1) between two adjacent semiconductor elements 1 at the time of disposing the semiconductor elements 1 is reduced by releasing the stretched state of the stretchable film to a predetermined mounting distance of a second distance (d2). In the releasing stretchable film from stretched state (S603), the mounting interval (second distance d2) of the semiconductor elements 1 in each of the group on the stretchable film 20 after released from the stretched state is in a range of 0 to 50 μm.

Accordingly, semiconductor devices 100 each including four semiconductor elements 1 can be obtained.

The mounting distance between the semiconductor elements 1 in each single group after the step of releasing stretchable film from stretched state (S603) is preferably substantially the same as the predetermined mounting interval between the semiconductor elements 1 in the group in the disposing wiring patterns (S601). That is, a predetermined mounting interval between the semiconductor elements 1 in a single group is preferably substantially the same as actual mounting interval. Such a configuration described above can facilitate obtaining of a semiconductor device 100B having predetermined mounting interval of semiconductor elements 1.

As shown in the above, a semiconductor light emitting element and a method of manufacturing the semiconductor light emitting element are ninth embodiment in accordance with the embodiments for carrying out the present invention, but the scope of the invention is not limited to the above description, and should be widely understood based on the scope of claim for patent. Further, based and so forth the above description, it will be obvious that various changes and modifications therein without departing from the scope of the invention.

In the method of mounting semiconductor elements described above, a single group including four semiconductor elements 1 arranged in a matrix and a single group including three semiconductor elements 1 arranged such that virtual straight line segments connecting centers of the three semiconductor elements 1 forms a triangular shape have been illustrated. Other than the configurations described above, a single group of any appropriate number of semiconductor elements 1 may be disposed on the stretchable film 20, or all the semiconductor elements 1 may be disposed spaced apart from one other at a uniform distance on the stretchable film 20. Also in such cases, in the disposing semiconductor elements (S101), the semiconductor elements 1 in each of the predetermined regions can be disposed with the first distance (d1) in a range of 50 to 500 μm, and in the step of releasing the stretchable film from the stretched state, the second distance (d2) of the mounting distance between adjacent semiconductor elements 1 can be in a range of 0 to 50 μm.

In the description above, the semiconductor elements 1 having a square shape have been illustrated, but the semiconductor elements 1 may have a rectangular shape. When each of the single semiconductor elements 1 has a rectangular shape and the plurality of semiconductor elements are disposed with two opposite first sides of each semiconductor element 1 respectively facing the first sides of adjacent semiconductor elements 1, the length of the first side being assumes as 1, the length of the sides perpendicular to the first sides of each of the semiconductor elements 1 can be in a range of 0.5 to 1.5, and the length of the first sides can be in a range of 300 μm to 2 mm.

In this case in the step of disposing semiconductor elements (S101), the semiconductor elements 1 can be disposed with the first distance (d1) in each of the predetermined regions in a range of 0.5 to 2 times with respect to the length of the first sides, and in the step of releasing the stretchable film from the stretched state (S102), the second distance (d2) of the mounting distance between adjacent semiconductor elements 1 can be in a range of 20 to 100% of a shrinkage percentage with respect to the distance before releasing the stretched state. In the specification, "shrinkage percentage" indicates a degree of reduction in the distance between adjacent semiconductor elements 1 in each of the predetermined regions before and after releasing the stretched state of the stretchable film 20. The shrinkage percentage of 20% indicates a state in which the mounting distance between adjacent semiconductor elements 1 is one fifth of the first distance and 100% indicates that the semiconductor elements 1 are in touch with each other.

As described above, the shrinkage percentage is similar as above, independent of the number of the semiconductor elements 1 in a single group, or of when the semiconductor elements are disposed separately without forming groups.

The semiconductor elements 1 may have any appropriate shape in a plan view, such as a triangular shape, a trapezoid shape, a rhombic shape, and a circular shape.

In the disposing semiconductor elements (S101), the stretchable film 20 may be stretched in two directions of positive and negative X-directions or in two directions of positive and negative Y-directions that are orthogonal to the X-directions.

Also in the disposing semiconductor elements (S101), the stretchable film 20 may be stretched outward in radial directions with respect to a center of the stretchable film.

The polishing covering member to expose electrodes (S204) may be performed such that the support substrate 21 is removed, and the molded product covered by the covering layer 2 is disposed on another support substrate, then polishing is performed.

In the method of mounting semiconductor elements and the method of manufacturing a semiconductor device according to certain embodiments of the invention, within a range without having an adverse effect on each operation, one or more operations which have not been described above may be included between the operations or before or after each operation. For example, an operation of removing unintended substance to remove unintended substances mixed in the course of manufacturing or the like may be included.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of mounting semiconductor elements, the method comprising:
   stretching a stretchable film against an elastic force into a stretched state;
   disposing a plurality of semiconductor elements in predetermined regions on the stretchable film in the stretched state, each of the predetermined regions to have a predetermined group of semiconductor elements spaced apart from one other at a first distance; and releasing the stretchable film from the stretched state by using the elastic force of the stretchable film;

wherein the first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state, wherein a respective one of the plurality of semiconductor elements has a rectangular shape in a plan view, when assuming a length of first sides in a first direction of adjacent semiconductor elements is 1, a ratio of length of second sides in a second direction perpendicular to the first direction is in a range of 0.5 to 1.5 times with respect to the length of the first side, and a length of the first sides in a range of 300 μm to 2 mm, and wherein in the disposing the plurality of semiconductor elements so as to be spaced apart from one other, the semiconductor elements are disposed such that the first distance among the semiconductor elements is in a range of 0.5 to 2 times with respect to 1, and releasing the stretchable film from the stretched state by using an elastic force of the stretchable film, obtaining a second distance of mounting distance between adjacent light-emitting elements in each predetermined group or between adjacent semiconductor elements in a range of 0.5 to 2 times with respect to the length of the first sides of 1.

2. The method of mounting semiconductor elements according to claim 1, wherein in the disposing the plurality of semiconductor elements so as to be spaced apart from one other, the stretchable film is attached to a fixture and is stretched using the fixture.

3. The method of mounting semiconductor elements according to claim 1, wherein in the disposing the plurality of semiconductor elements so as to be spaced apart from one other, the stretchable film is stretched into a stretched state and secured to a fixture.

4. The method of mounting semiconductor elements according to claim 1, wherein in the disposing the plurality of semiconductor elements so as to be spaced apart from one other, the stretchable film is stretched in two directions of positive and negative X-directions or in two directions of positive and negative Y-directions that are orthogonal to the X-directions.

5. The method of mounting semiconductor elements according to claim 1, wherein in the disposing the plurality of semiconductor elements so as to be spaced apart from one other, the stretchable film is stretched in four directions of positive and negative X-directions and positive and negative Y-directions that are orthogonal to the X-directions.

6. The method of mounting semiconductor elements according to claim 1, wherein in the disposing the plurality of semiconductor elements so as to be spaced apart from one other, the stretchable film is stretched outward in radial directions with respect to a center of the stretchable film.

7. The method of mounting semiconductor elements according to claim 1, wherein the plurality of semiconductor elements comprise semiconductor light-emitting elements.

8. The method of mounting semiconductor elements according to claim 1, wherein in the disposing the plurality of semiconductor elements so as to be spaced apart from one other, a plurality of groups each including four semiconductor elements which are arranged in a 2×2 matrix, are arranged in another matrix, and in the releasing the stretchable film from the stretched state, the first distance among the four semiconductor elements in each of the groups is reduced to the predetermined second distance of the mounting distance.

9. The method of mounting semiconductor elements according to claim 1, wherein in the disposing the plurality of semiconductor elements so as to be spaced apart from one other, a plurality of groups of the semiconductor elements, each of the groups including three semiconductor elements which are configured such that virtual straight line segments connecting centers of the three semiconductor elements form a triangular shape, are configured in a matrix, and in the releasing the stretchable film from the stretched state, the first distance among the three semiconductor elements in each of the groups is reduced to the predetermined second distance of the mounting distance.

10. The method of mounting semiconductor elements according to claim 9, wherein the three semiconductor elements in each of the groups are a first semiconductor light-emitting element configured to emit blue light, a second semiconductor light-emitting element configured to emit green light, and a third semiconductor light-emitting element configured to emit red light.

11. The method of mounting semiconductor elements according to claim 1, wherein in the disposing the plurality of semiconductor elements so as to be spaced apart from one other, the semiconductor elements are disposed with the first distance in a range of 50 to 500 μm, and in the releasing the stretchable film from the stretched state, the predetermined second distance of the mounting distance is in a range of 0 to 50 μm.

12. The method of mounting semiconductor elements according to claim 1, wherein in the disposing a plurality of semiconductor elements so as to be spaced apart from one other, each of the plurality of semiconductor elements has electrodes and the plurality of semiconductor elements are disposed on the stretchable film such that surfaces of the semiconductor elements opposite from the electrodes are opposite to the stretchable film.

13. A method of manufacturing a semiconductor device, the method comprising:
performing the method of mounting semiconductor elements according to claim 12;
disposing the semiconductor elements on a support substrate such that the electrodes are opposite to the support substrate;
removing the stretchable film;
covering the semiconductor elements by a covering member; and
separating predetermined groups of the semiconductor elements into discrete groups.

14. The method of manufacturing a semiconductor device according to claim 13, further comprising:
after the covering the semiconductor elements by the covering member, removing the support substrate.

15. A method of manufacturing a semiconductor device, the method comprising:
performing the method of mounting semiconductor elements according to claim 12;
disposing the semiconductor elements on a support substrate such that the electrodes are to the support substrate;
disposing a covering member covering lateral surfaces of a respective one of the plurality of semiconductor elements between the support substrate and the stretchable film;
removing the stretchable film; and separating the plurality of semiconductor elements into predetermined groups.

16. The method of manufacturing a semiconductor device according to claim 15 further comprising, after the disposing a covering member, removing the support substrate.

17. A method of mounting semiconductor elements, the method comprising:
    stretching a stretchable film against an elastic force into a stretched state;
    disposing a plurality of semiconductor elements in predetermined regions on the stretchable film in the stretched state, each of the predetermined regions to have a predetermined group of semiconductor elements spaced apart from one other at a first distance; and
    releasing the stretchable film from the stretched state by using the elastic force of the stretchable film;
    wherein the first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state,
    further comprising, prior to the disposing the plurality of semiconductor elements so as to be spaced apart from one other, disposing a group of wiring patterns on the stretchable film, the group of wiring patterns comprising a plurality of pairs of wiring patterns each having a first wiring and a second wiring and a region for mounting a corresponding one of the plurality of semiconductor elements, the plurality of pairs of wiring patterns being disposed at uniform intervals such that regions for mounting the plurality of semiconductor elements are aligned in a transverse direction in a plan view.

18. The method of mounting semiconductor elements according to claim 17, wherein a resultant mounting interval of the semiconductor elements after the releasing the stretchable film from the stretched state is substantially the same as an intended mounting interval of the semiconductor elements in the disposing a wiring pattern.

19. A method of mounting semiconductor elements, the method comprising:
    stretching a stretchable film against an elastic force into a stretched state;
    disposing a plurality of semiconductor elements in predetermined regions on the stretchable film in the stretched state, each of the predetermined regions to have a predetermined group of semiconductor elements spaced apart from one other at a first distance; and
    releasing the stretchable film from the stretched state by using the elastic force of the stretchable film;
    wherein the first distance between adjacent semiconductor elements in each of the predetermined regions at the time of disposing the semiconductor elements on the stretchable film in the stretched state is reduced to a predetermined second distance of a predetermined mounting distance after releasing the stretchable film from the stretched state,
    wherein in the disposing the plurality of semiconductor elements so as to be spaced apart from one other, each of the plurality of semiconductor elements has electrodes and the plurality of semiconductor elements are disposed on the stretchable film such that the electrodes are opposite to the stretchable film.

20. A method of manufacturing a semiconductor device, the method comprising:
    performing the method of mounting semiconductor elements according to claim 19;
    covering the semiconductor elements by a covering member; and
    removing the stretchable film to expose the electrodes of each of the semiconductor elements.

21. The method of manufacturing a semiconductor device according to claim 20, further comprising:
    after covering the semiconductor elements by a covering member and prior to or after the removing the stretchable film to expose the electrodes of each of the semiconductor elements, separating the semiconductor elements into predetermined groups.

22. A method of manufacturing a semiconductor device, the method comprising:
    performing the method of mounting semiconductor elements according to claim 19;
    disposing the semiconductor elements on a support substrate such that surfaces of the semiconductor elements opposite from the electrodes are opposite to the support substrate; and
    removing the stretchable film to expose the electrodes of each of the semiconductor elements.

23. The method of manufacturing a semiconductor device according to claim 22, further comprising:
    after the removing the stretchable film to expose the electrodes of each of the semiconductor elements, covering the semiconductor elements by a covering member to cover the electrodes of a respective one of the semiconductor elements; and
    polishing the covering member to expose the electrodes of each of the semiconductor elements.

24. The method of manufacturing a semiconductor device according to claim 23, further comprising:
    after the polishing the covering member to expose the electrodes of each of the semiconductor elements, removing the support substrate; and
    separating predetermined groups of the semiconductor elements into discrete groups.

25. A method of manufacturing a semiconductor device, the method comprising:
    disposing a wiring pattern on a stretchable film;
    stretching a stretchable film against an elastic force into a stretched state and disposing a plurality of semiconductor elements in predetermined regions on the stretchable film in the stretched state, each of the predetermined regions to have a predetermined group of semiconductor elements spaced apart from one other at a first distance; and
    releasing the stretchable film from the stretched state by using the elastic force of the stretchable film;
    wherein in the disposing a wiring pattern, the wiring pattern comprising a plurality of pairs of wiring patterns, each pair of wiring patterns having a first wiring and a second wiring and a region for mounting a corresponding one of the plurality of semiconductor elements, the plurality of pairs of wiring patterns being disposed at a uniform interval such that regions for mounting a respective one of the plurality of semiconductor elements are aligned in a transverse direction in a plan view, and
    wherein a second distance that is the mounting interval between respective adjacent light-emitting elements is smaller than the first distance.

* * * * *